US012708036B2

(12) United States Patent
Kim et al.

(10) Patent No.: US 12,708,036 B2
(45) Date of Patent: Aug. 11, 2026

(54) DISPLAY DEVICE

(71) Applicant: Samsung Display Co., LTD., Yongin-si (KR)

(72) Inventors: Jun Yong Kim, Bucheon-si (KR); Sung Hoon Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 883 days.

(21) Appl. No.: 17/391,564

(22) Filed: Aug. 2, 2021

(65) Prior Publication Data

US 2022/0045042 A1 Feb. 10, 2022

(30) Foreign Application Priority Data

Aug. 7, 2020 (KR) ........................ 10-2020-0099371

(51) Int. Cl.
*H01L 29/18* (2006.01)
*H01L 25/16* (2023.01)
*H01L 33/00* (2010.01)

(52) U.S. Cl.
CPC .................................. *H01L 25/167* (2013.01)

(58) Field of Classification Search
CPC ... H01L 25/167; H01L 33/62; H01L 25/0753; G02F 2001/133388
See application file for complete search history.

(56) References Cited

U.S. PATENT DOCUMENTS 9,570,425 B2 2/2017 Do
10,490,607 B2 11/2019 Zheng et al.
10,901,461 B2 1/2021 Wu et al.
2005/0270444 A1 12/2005 Miller et al.
2016/0211245 A1 7/2016 Do
(Continued)

FOREIGN PATENT DOCUMENTS

CN 107665637 A 2/2018
CN 107819023 A 3/2018
(Continued)

OTHER PUBLICATIONS

International Search Report corresponding to International Application No. PCT/KR2021/010402 dated Nov. 30, 2021.
(Continued)

*Primary Examiner* — Ismail A Muse
(74) *Attorney, Agent, or Firm* — Womble Bond Dickinson (US) LLP

(57) ABSTRACT

A display device comprises a display area in which pixels comprising subpixels are arranged, a non-display area which surrounds the display area, electrodes, each of which includes at least a part extending in a direction in the display area and is spaced apart from each other in each of the subpixels, light emitting elements which are disposed on the electrodes in the emission area, and contact electrodes, each contacting the light emitting elements and one of the electrodes, wherein the pixels comprise a first-type pixel which is disposed in the display area and a second-type pixel which is disposed in an outermost part of the display area, and a number of light emitting elements per unit area in the emission area of the first-type pixel is different from a number of light emitting elements per unit area in the emission area of the second-type pixel.

20 Claims, 25 Drawing Sheets

(56) References Cited

U.S. PATENT DOCUMENTS

| | | | | |
|---|---|---|---|---|
| 2018/0090061 | A1* | 3/2018 | Kim | H10K 50/805 |
| 2018/0158847 | A1 | 6/2018 | Chang et al. | |
| 2018/0175009 | A1* | 6/2018 | Kim | H01L 33/20 |
| 2018/0321708 | A1* | 11/2018 | Wu | G06F 3/0443 |
| 2019/0019849 | A1 | 1/2019 | Zheng et al. | |
| 2020/0006444 | A1 | 1/2020 | Li et al. | |

FOREIGN PATENT DOCUMENTS

| | | | | | |
|---|---|---|---|---|---|
| CN | 108803922 | A | | 11/2018 | |
| CN | 108321183 | B | * | 3/2021 | H01L 27/3211 |
| JP | 6646982 | | | 2/2020 | |
| KR | 10-2017-0051674 | | | 5/2017 | |
| KR | 10-1782889 | | | 9/2017 | |
| KR | 10-2017-0113867 | | | 10/2017 | |
| KR | 10-2017-0129314 | | | 11/2017 | |
| KR | 10-2017-0141305 | | | 12/2017 | |
| KR | 10-2018-0030007 | | | 3/2018 | |
| KR | 10-2020-0088962 | | | 7/2020 | |
| WO | 2013/084261 | | | 6/2013 | |
| WO | 2015/005654 | | | 1/2015 | |

OTHER PUBLICATIONS

Written Opinion corresponding to International Application No. PCT/KR2021/010402 dated Nov. 30, 2021.

Office Action issued in Chinese Patent Application No. CN 202180056761.7 on Mar. 31, 2026.

* cited by examiner

DISPLAY DEVICE

CROSS-REFERENCE TO RELATED APPLICATION(S)

This application claims priority to and the benefit of Korean Patent Application No. 10-2020-0099371 under 35 U.S.C. § 119, filed in the Korean Intellectual Property Office (KIPO) on Aug. 7, 2020, the entire contents of which are incorporated herein by reference.

BACKGROUND

1. Technical Field

The disclosure relates to a display device.

2. Description of the Related Art

Display devices are becoming increasingly important with the development of multimedia. Accordingly, various types of display devices such as organic light emitting displays and liquid crystal displays are being used.

A display device is a device for displaying an image and includes a display panel such as an organic light emitting display panel or a liquid crystal display panel. As a light emitting display panel, the display panel may include light emitting elements such as light emitting diodes (LEDs). For example, the LEDs may be organic light emitting diodes (OLEDs) using an organic material as a fluorescent material or may be inorganic LEDs using an inorganic material as the fluorescent material.

SUMMARY

Aspects of the disclosure provide a display device which includes pixels having different luminances per unit area according to their positions.

Aspects of the disclosure also provide a display device having curved corners, in which boundaries of pixels are prevented from being seen in a display area in the corners.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device comprising a display area in which a plurality of pixels comprising a plurality of subpixels are arranged, the plurality of subpixels each including an emission area, a non-display area which surrounds the display area, a plurality of electrodes, each of which includes at least a part extending in a direction in the display area and is spaced apart from each other in each of the plurality of subpixels, a plurality of light emitting elements which are disposed on the plurality of electrodes in the emission area, and a plurality of contact electrodes, each contacting the plurality of light emitting elements and one of the plurality of electrodes, wherein the plurality of pixels may comprise a first-type pixel which is disposed in the display area, and a second-type pixel which is disposed in an outermost part of the display area, and a number of light emitting elements per unit area in the emission area of the first-type pixel is different from a number of light emitting elements per unit area in the emission area of the second-type pixel.

The display device may comprise a first side which extends in a first direction, a second side which extends in a second direction different from the first direction, and a corner. The first side and the second side may meet at the corner, an outer side of the corner may be curved, and the second-type pixel may be disposed along the outer side of the corner.

The display device may further comprise a third-type pixel which is disposed in the outermost part of the display area to correspond to the first side and the second side. A number of light emitting elements per unit area in the emission area of the third-type pixel may be different from the number of light emitting elements per unit area in the emission area of the second-type pixel.

An area of the emission area of each of the plurality of subpixels of the second-type pixel may be equal to an area of the emission area of each of the plurality of subpixels of the first-type pixel, and a number of light emitting elements in the emission area of the second-type pixel is smaller than a number of light emitting elements in the emission area of the first-type pixel.

The plurality of pixels may comprise a fourth-type pixel which is disposed inside and adjacent to the second-type pixel in the display area, and a number of light emitting elements per unit area in the emission area of the fourth-type pixel is different from the number of light emitting elements per unit area in the emission area of the first-type pixel and the number of light emitting elements per unit area in the emission area of the second-type pixel.

An area of the emission area of each of the plurality of subpixels of the second-type pixel may be equal to each other, and an area of the emission area of each of the plurality of subpixels of the second-type pixel may be different from an area of the emission area of each of the plurality of subpixels of the first-type pixel.

The area of the emission area of each of the plurality of subpixels of the second-type pixel may be smaller than the area of the emission area of each of the plurality of subpixels of the first-type pixel, and a number of light emitting elements in the emission area of each of the plurality of subpixels of the second-type pixel may be equal to a number of light emitting elements in the emission area of each of the plurality of subpixels of the first-type pixel.

The area of the emission area of each of the plurality of subpixels of the second-type pixel may be smaller than the area of the emission area of each of the plurality of subpixels of the first-type pixel, and a number of light emitting elements in the emission area of each of the plurality of subpixels of the second-type pixels may be smaller than a number of light emitting elements in the emission area of each of the plurality of subpixels of the first-type pixel.

The area of the emission area of each of the plurality of subpixels of the second-type pixel may be larger than an area of the emission area of each of the plurality of subpixels of the first-type pixel in the area, and a number of light emitting elements in the emission area of each of the plurality of subpixels of the second-type pixel may be smaller than a number of light emitting elements in the emission area of each of the plurality of subpixels of the first-type pixel.

An area of the emission area of each of the plurality of subpixels of the first-type pixel may be each to each other, a number of light emitting elements in the emission area of each of the plurality of subpixels of the first-type pixel may be equal to each other, an area of the emission area of each of the plurality of subpixels of the second-type pixel may be different from each other, and an area of the emission area of at least one of the plurality of subpixels of the second-type pixel may be different from an area of the emission area of each of the plurality of subpixels of the first-type pixel.

A number of light emitting elements in the emission area of each of the plurality of subpixels of the second-type pixel may be equal to a number of light emitting elements in the emission area of each of the plurality of subpixels of the first-type pixel.

A number of light emitting elements in the emission area of each of the plurality of subpixels of the second-type pixel may be different from a number of light emitting elements in the emission area of each of the plurality of subpixels of the first-type pixel.

A number of light emitting elements in the emission area of each of the plurality of subpixels of the second-type pixel may be different from each other.

Each of the plurality of electrodes disposed in each of the plurality of subpixels of the second-type pixel may comprise an electrode bent part curved in another direction perpendicular to the direction, and the plurality of subpixels of the second-type pixel may be arranged in a diagonal direction between the direction and the another direction.

Each of the plurality of electrodes disposed in each of the plurality of subpixels of the second-type pixel may comprise an electrode extending part connected to the electrode bent part and extending in the another direction, and the plurality of subpixels of the second-type pixel may be arranged in the another direction perpendicular to the direction.

According to an embodiment of the disclosure, a display device comprising a first side which extends in a first direction, a second side which extends in a second direction different from the first direction, and a corner. The first side and the second side meet at the corner, and an outer side of the corner may be curved. The display device may further comprise a plurality of pixels comprising a plurality of electrodes extending in a direction, a plurality of light emitting elements, each of the plurality of light emitting elements comprising ends disposed on the plurality of electrodes, and a plurality of contact electrodes each contacting the plurality of light emitting elements and one of the plurality of electrodes, and the plurality of pixels may comprise a plurality of first-type pixels, a plurality of second-type pixels which are disposed in an outermost part to surround the first-type pixels and are disposed in the corner, and a plurality of third-type pixels which are disposed to correspond to the first side and the second side, and a number of light emitting elements per unit area of an emission area of the plurality of second-type pixels may be different from a number of light emitting elements per unit area of an emission area of the plurality of first-type pixels.

A number of light emitting elements of each of the plurality of second-type pixels may be different from a number of light emitting elements of each of the plurality of first-type pixels.

An area of the emission area of each of the plurality of second-type pixels may be different from an area of the emission area of each of the plurality of first-type pixels.

A number of light emitting elements per unit area in an emission area of the plurality of third-type pixels may be different from a number of light emitting elements per unit area in the emission area of the plurality of second-type pixels.

The display device may further comprise a plurality of fourth-type pixels which are disposed between the plurality of first-type pixels and the plurality of second-type pixels. A number of light emitting elements per unit area in an emission area of each of the plurality of fourth-type pixels may be different from a number of light emitting elements per unit area in the emission area of each of the plurality of first-type pixels and a number of light emitting elements per unit area in the emission area of each of the plurality of second-type pixels.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being “on” another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the attached drawings.

Figure 1:
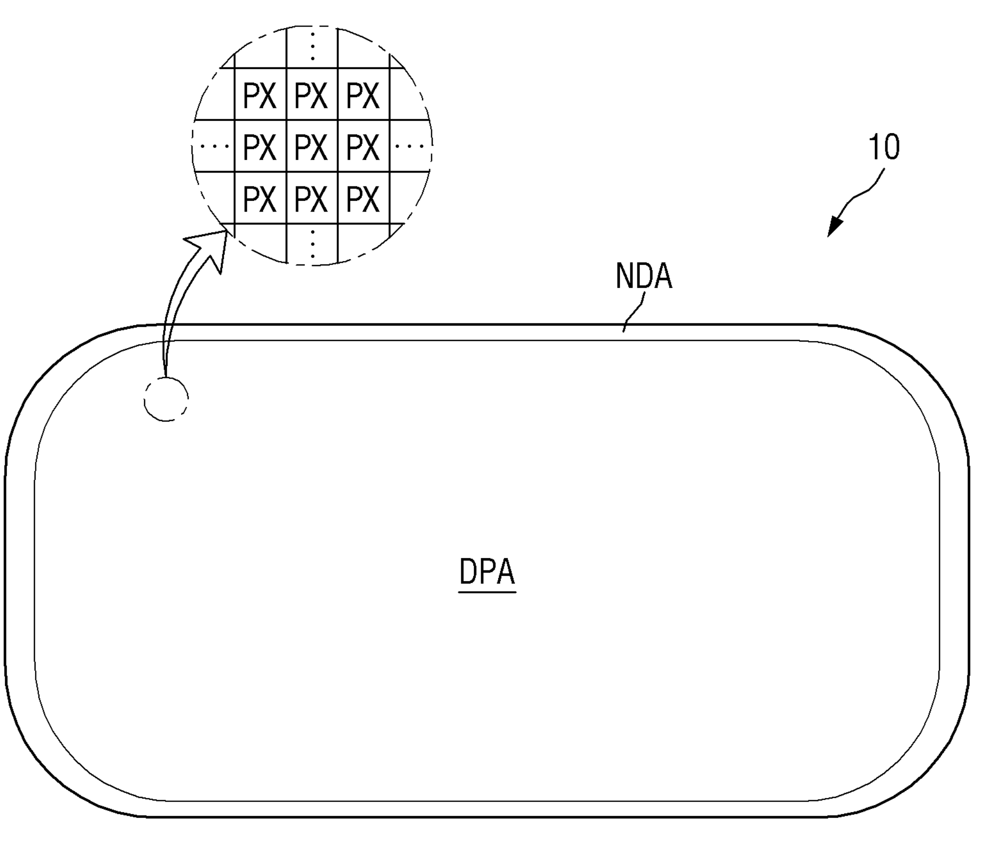
FIG. 1 is a schematic plan view of a display device according to an embodiment.
Figure 1:
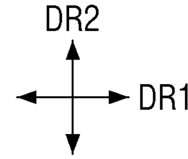

FIG. 1 is a schematic plan view of a display device 10 according to an embodiment.

Referring to FIG. 1, the display device 10 may display moving images or still images. The display device 10 may refer to any electronic device that provides a display screen. Examples of the display device 10 may include televisions, laptop computers, monitors, billboards, Internet of things (IoT) devices, mobile phones, smartphones, tablet personal computers (PCs), electronic watches, smart watches, watch phones, head-mounted displays, mobile communication terminals, electronic notebooks, electronic books, portable multimedia players (PMPs), navigation devices, game consoles, digital cameras, and camcorders, which provide a display screen.

The display device 10 may include a display panel that provides a display screen. Examples of the display panel may include inorganic light emitting diode display panels, organic light emitting display panels, quantum dot light emitting display panels, plasma display panels, and field emission display panels. A case where an inorganic light emitting diode display panel is applied as an example of the display panel will be described below, but the disclosure is not limited to this case, and other display panels may also be applied as long as the same technical spirit is applicable.

The shape of the display device 10 can be variously modified. For example, the display device 10 may have various shapes such as a horizontally long rectangle, a vertically long rectangle, a square, a quadrangle with rounded corners (vertices), other polygons, and a circle. The shape of a display area DPA of the display device 10 may be similar to the overall shape of the display device 10. In FIG. 1, each of the display device 10 and the display area DPA is shaped like a horizontally long rectangle.

The display device 10 may include the display area DPA and a non-display area NDA. The display area DPA may be an area where an image may be displayed, and the non-display area NDA may be an area where an image is not displayed. The display area DPA may also be referred to as an active area, and the non-display area NDA may also be referred to as an inactive area. The display area DPA may generally occupy a center of the display device 10.

The display area DPA may include pixels PX. The pixels PX may be arranged in a matrix direction. Each of the pixels PX may be rectangular or square in a plan view. However, the disclosure is not limited thereto, and each of the pixels PX may also have a rhombic shape having each side inclined with respect to a direction. The pixels PX may be alternately arranged in a stripe or PENTILE™ type. In addition, each of the pixels PX may include one or more light emitting elements which emit light of a specific wavelength band to display a specific color.

The non-display area NDA may be disposed around the display area DPA. The non-display area NDA may entirely or partially surround the display area DPA. The display area DPA may be rectangular, and the non-display area NDA may be disposed adjacent to four sides of the display area DPA. The non-display area NDA may form a bezel of the display device 10. In each non-display area NDA, wirings or circuit drivers included in the display device 10 may be disposed, or external devices may be mounted.

Figure 2:
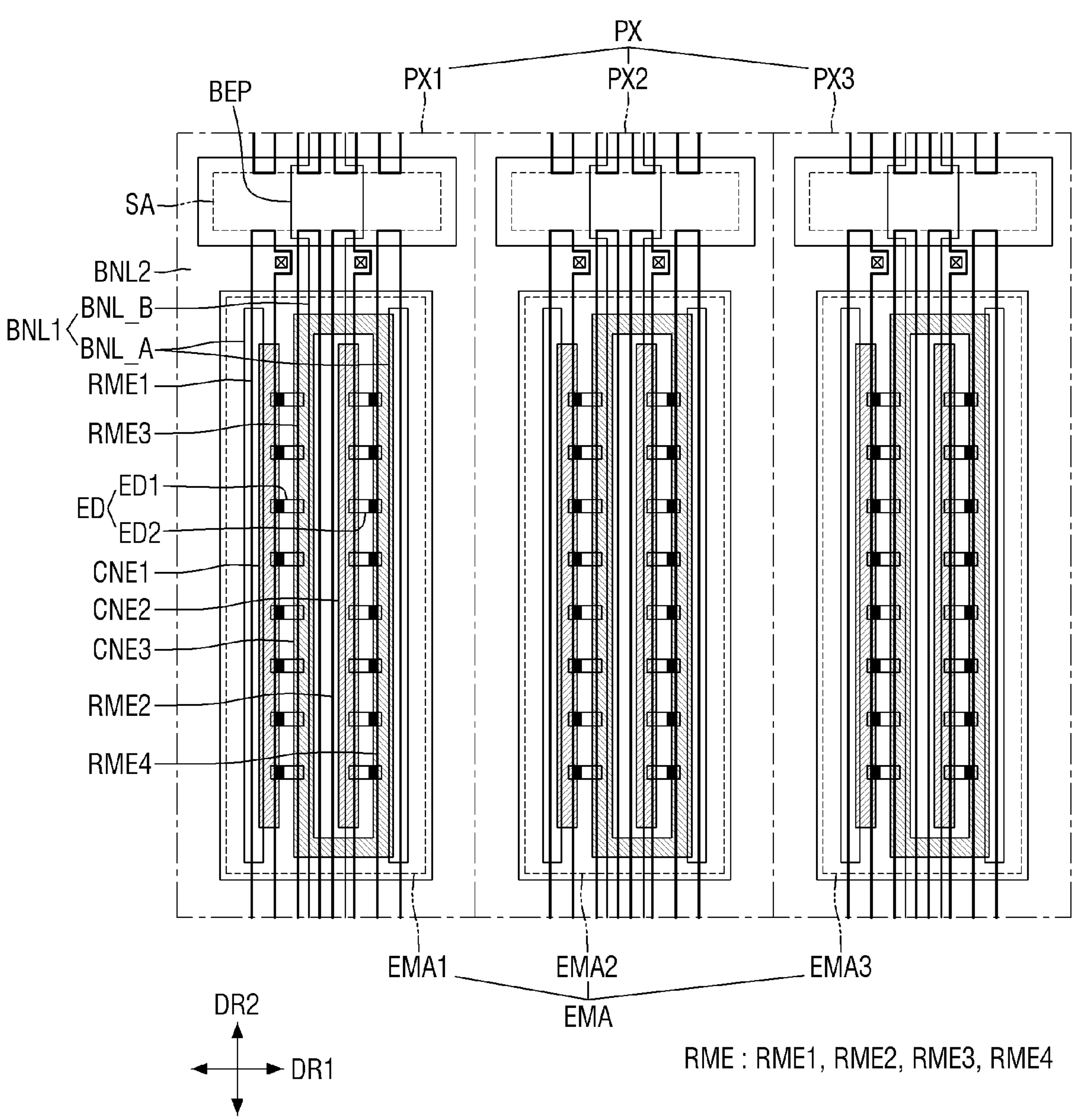
FIG. 2 is a schematic plan view of a pixel of the display device according to an embodiment.

FIG. 2 is a schematic plan view of a pixel PX of the display device 10 according to the embodiment.

Referring to FIG. 2, each of the pixels PX of the display device 10 may include subpixels PXn (where n is an integer of 1 to 3). For example, a pixel PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. For example, the first color may be blue, the second color may be green, and the third color may be red. However, the disclosure is not limited thereto, and the subpixels PXn may also emit light of the same color. Although FIG. 2 illustrates that the pixel PX may include three subpixels PXn, the disclosure is not limited thereto, and the pixel PX may also include a greater number of subpixels PXn.

Each subpixel PXn of the display device 10 may include an emission area EMA and a non-emission area (not illustrated). The emission area EMA may be an area in which light emitting elements ED are disposed to emit light of a specific wavelength band, and the non-emission area may be an area in which the light emitting elements ED are not disposed and from which no light is output because light emitted from the light emitting elements ED does not reach the non-emission area. The emission area EMA may include an area in which the light emitting elements ED are disposed and an area which is adjacent to the light emitting elements ED and to which light emitted from the light emitting elements ED is output.

However, the disclosure is not limited thereto, and the emission area EMA may also include an area from which light emitted from the light emitting elements ED is output after being reflected or refracted by other members. Multiple light emitting elements ED may be disposed in each subpixel PXn and may include an area where the light emitting elements ED are disposed and an area adjacent thereto to form the emission area EMA.

Although a first emission area EMA1 of the first subpixel PX1, a second emission area EMA2 of the second subpixel PX2, and a third emission area EMA3 of the third subpixel PX3 have substantially the same area in the drawing, the disclosure is not limited thereto. In some embodiments, each of the first to third emission areas EMA1 to EMA3 of the first to third subpixels PX1 to PX3 may have a different area depending on the color or wavelength band of light emitted from the light emitting elements ED disposed in the corresponding subpixel PXn.

Each subpixel PXn may include a subarea SA in which the non-emission area is disposed and an area other than the subarea SA. The subarea SA may be disposed on a side of the emission area EMA in a second direction DR2 and may be disposed between the emission areas EMA of subpixels PXn neighboring in the second direction DR2. For example, emission areas EMA and subareas SA may be arranged in the display area DPA of the display device 10. For example, the emission areas EMA and the subareas SA may be repeatedly arranged in a first direction DR1 but may be alternately arranged in the second direction DR2. A second bank BNL2 may be disposed between the subareas SA and the emission areas EMA, and a gap therebetween may vary according to a width of the second bank BNL2. Light may not exit from the subarea SA because the light emitting elements ED are not disposed in the subarea SA, but parts of electrodes RME disposed in each subpixel PXn may be disposed in the subarea SA. The electrodes RME disposed in each subpixel PXn may be separated in the subarea SA from the electrodes RME disposed in a neighboring pixel PX. However, the disclosure is not limited thereto, and the electrodes RME disposed in each subpixel PXn may also not be separated in the subarea SA from the electrodes RME disposed in the neighboring pixel PX. An area of the non-emission area other than the subarea SA may be defined as a second area and may be an area other than the subarea SA and the emission area EMA.

In the display device 10 according to the embodiment, corners where the long sides extending in the first direction DR1 and the short sides extending in the second direction DR2 meet each other may be curved. Therefore, corners of the display area DPA may also be curved. In an embodiment in which the pixels PX are arranged in a stripe type or a Pentile® type, pixels PX adjacent to each corner of the display area DPA may be disposed along a curved edge. However, since a single pixel PX does not have a shape corresponding to the curved edge of the display area DPA in a plan view, a part of the display area DPA where the pixels PX are not disposed may be formed in an outermost part of each corner according to the arrangement of the pixels PX. For example, pixels PX disposed in an outermost part of the display area DPA may be disposed in a staircase shape along the shape of each corner, and an area where the pixels PX are not disposed may exist between the pixels PX disposed in the staircase shape and the non-display area NDA.

Since the area where the pixels PX are not disposed is in the display area DPA, a boundary between the area and the outermost pixels PX may be visually recognized in the display area DPA. To prevent this, in the display device 10 according to the embodiment, pixels PX disposed in the outermost part and adjacent to the non-display area NDA among the pixels PX disposed adjacent to each corner may have a different luminance from pixels PX disposed inside the pixels PX. For example, outermost pixels PX at each corner may have a lower luminance than that of pixels PX disposed inside the outermost pixels PX, and a part of the display area DPA which is adjacent to the non-display area NDA may be faded so that the luminance gradually decreases from the inner pixels PX toward the outermost pixels PX. Accordingly, the difference in luminance between the outermost pixels PX at each corner and the pixels PX disposed inside the outermost pixels PX may prevent boundaries of the pixels PX disposed in each corner of the display area DPA from being visually recognized from the outside. The display device 10 according to the embodiment may prevent the boundaries or arrangement of the outermost pixels PX from being visually recognized from the outside in the display area DPA at each corner by adjusting the luminances of the outermost pixels PX and the pixels PX disposed inside the outermost pixels PX among the pixels PX disposed at each curved corner of the display area DPA. The structure and arrangement of the outermost pixels PX having the adjusted luminances will be described in detail below with reference to other drawings.

Figure 3:
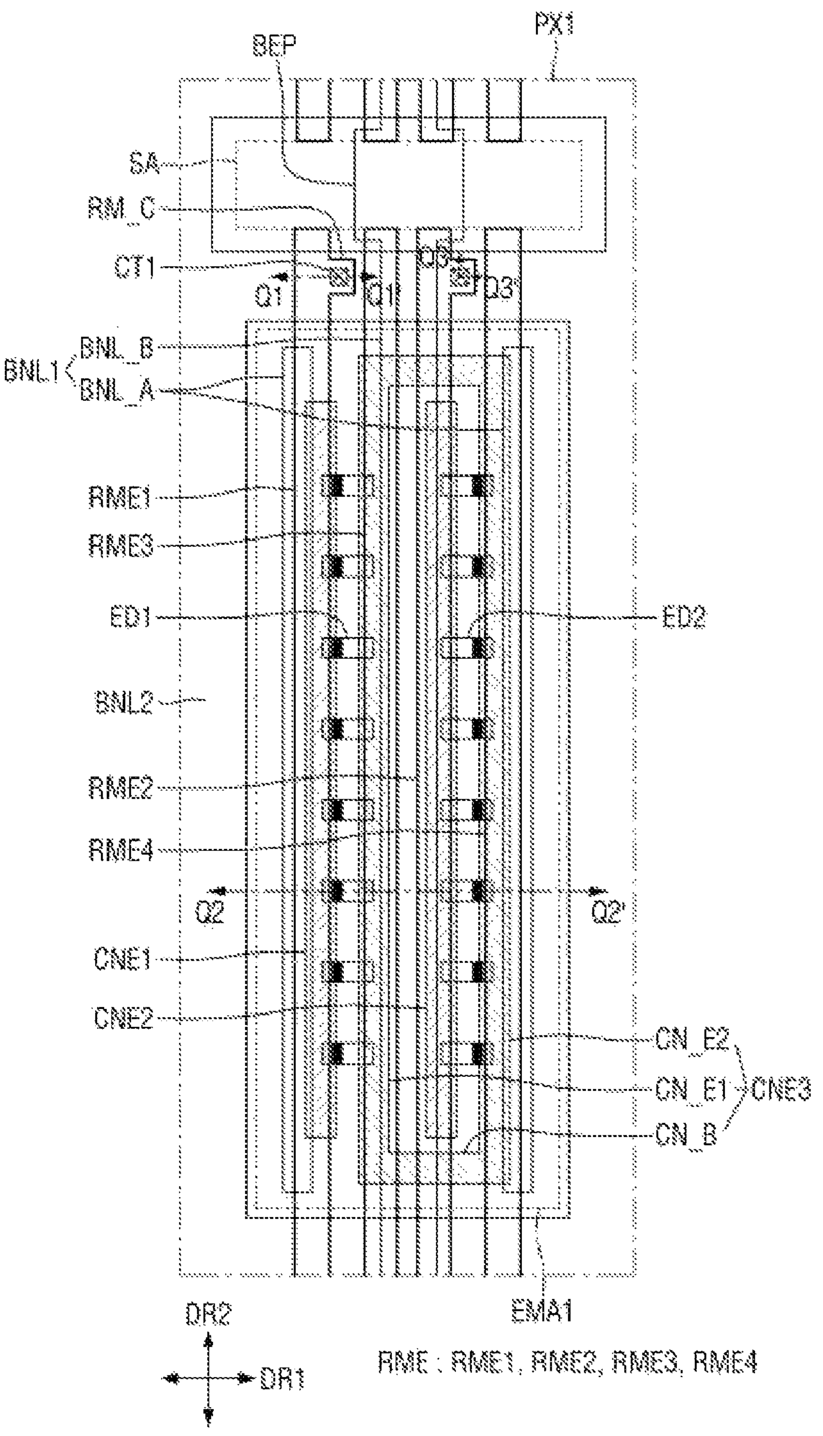
FIG. 3 is a schematic plan view of a first subpixel of FIG. 2.
Figure 4:
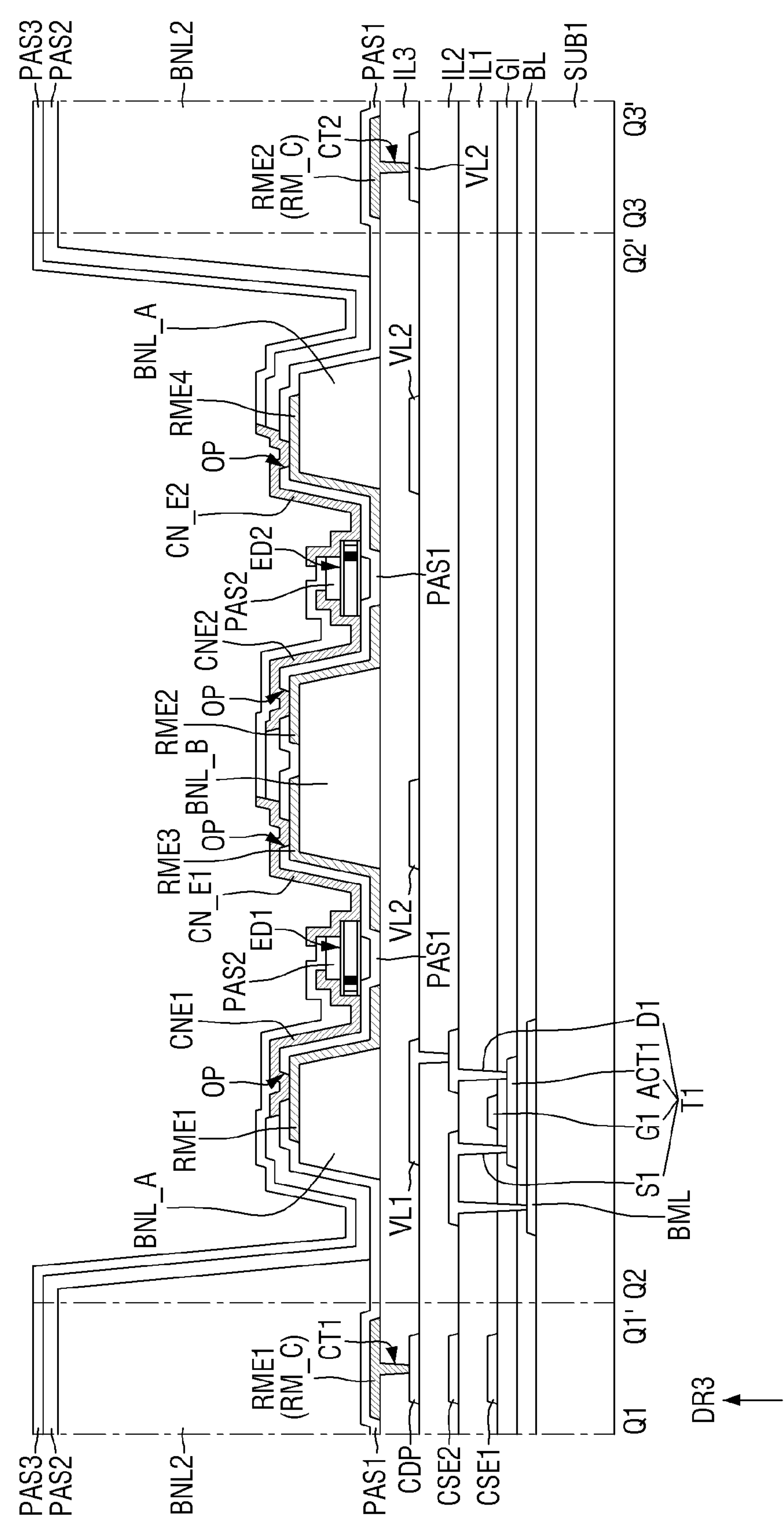
FIG. 4 is a cross-sectional view taken along lines Q1-Q1', Q2-Q2', and Q3-Q3' of FIG. 3.

FIG. 3 is a schematic plan view of the first subpixel PX1 of FIG. 2. FIG. 4 is a schematic cross-sectional view taken along lines Q1-Q1', Q2-Q2', and Q3-Q3' of FIG. 3. FIG. 4 illustrates a cross section across ends of the light emitting elements ED disposed in a subpixel PXn.

Referring to FIGS. 3 and 4 in conjunction with FIG. 2, the display device 10 may include a first substrate SUB1, a semiconductor layer, conductive layers, and insulating layers disposed on the first substrate SUB1. The semiconductor layer, the conductive layers, and the insulating layers may form (or constitute) a circuit layer and a display element layer of the display device 10.

The first substrate SUB1 may be an insulating substrate. The first substrate SUB1 may be made of an insulating material such as glass, quartz, or polymer resin. The first substrate SUB1 may be a rigid substrate but may also be a flexible substrate that may be bent, folded, rolled, or the like.

A first conductive layer may be disposed on the first substrate SUB1. The first conductive layer may include a bottom metal layer BML, and the bottom metal layer BML may overlap an active layer ACT1 of a first transistor T1. The bottom metal layer BML may include a light blocking material to prevent light from entering the active layer ACT1 of the first transistor T1. For example, the bottom metal layer BML may be made of an opaque metal material that blocks transmission of light. However, the disclosure is not limited thereto. In some cases, the bottom metal layer BML may be omitted.

A buffer layer BL may be entirely disposed on the bottom metal layer BML and the first substrate SUB1. The buffer layer BL may be formed on the first substrate SUB1 to protect the first transistors T1 of each pixel PX from moisture introduced through the first substrate SUB1 which is vulnerable to moisture penetration and may perform a surface planarization function.

The semiconductor layer may be disposed on the buffer layer BL. The semiconductor layer may include the active layer ACT1 of the first transistor T1. The active layer ACT1 of the first transistor T1 may be partially overlapped by a gate electrode G1 of a second conductive layer which will be described below.

Although only the first transistor T1 among the transistors included in each subpixel PXn of the display device 10 is illustrated in the drawings, the disclosure is not limited thereto. The display device 10 may include a greater number of transistors. For example, the display device 10 may include two or three transistors by including, in each subpixel PXn, one or more transistors in addition to the first transistor T1.

The semiconductor layer may include polycrystalline silicon, monocrystalline silicon, an oxide semiconductor, or the like. In case that the semiconductor layer includes an oxide semiconductor, each active layer ACT1 may include conducting regions and a channel region disposed therebetween. The oxide semiconductor may include indium (in), For example, the oxide semiconductor may be at least one among indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

In another embodiment, the semiconductor layer may include polycrystalline silicon. The polycrystalline silicon may be formed by crystallizing amorphous silicon. In this case, each of the conducting regions of the active layer ACT1 may be a doping region doped with impurities.

A first gate insulating layer GI may be disposed on the semiconductor layer and the buffer layer BL. The first gate insulating layer GI may function as a gate insulating film of each transistor.

The second conductive layer may be disposed on the first gate insulating layer GI. The second conductive layer may include the gate electrode G1 of the first transistor T1 and a first capacitive electrode CSE1 of a storage capacitor. The gate electrode G1 may overlap the channel region of the active layer ACT1 in a thickness direction. The first capacitive electrode CSE1 may be overlapped by a second capacitive electrode CSE2, which will be described below, in the thickness direction. In some embodiments, the first capacitive electrode CSE1 may be integrally connected to the gate electrode G1.

A first interlayer insulating layer IL1 may be disposed on the second conductive layer. The first interlayer insulating layer IL1 may function as an insulating film between the second conductive layer and other layers disposed on the second conductive layer. The first interlayer insulating layer IL1 may cover or overlap the second conductive layer to protect the second conductive layer.

A third conductive layer may be disposed on the first interlayer insulating layer IL1. The third conductive layer may include a first source electrode S1 and a first drain electrode D1 of the first transistor T1 and the second capacitive electrode CSE2.

The first source electrode S1 and the first drain electrode D1 of the first transistor T1 may respectively contact the doping regions of the active layer ACT1 through contact holes penetrating the first interlayer insulating layer IL1 and the first gate insulating layer GI. The first source electrode S1 of the first transistor T1 may contact the bottom metal layer BML through another contact hole.

The second capacitive electrode CSE2 may overlap the first capacitive electrode CSE1 in the thickness direction. In an embodiment, the second capacitive electrode CSE2 may be integrally connected to (or integral with) the first source electrode S1. The storage capacitor may be formed between the first capacitive electrode CSE1 and the second capacitive electrode CSE2.

Although not illustrated in the drawings, the third conductive layer may further include a data line that transmits a data signal to other transistors. The data line may be electrically connected to source/drain electrodes of other transistors to transmit a received signal.

A second interlayer insulating layer IL2 may be disposed on the third conductive layer. The second interlayer insulating layer IL2 may function as an insulating film between the third conductive layer and other layers disposed on the third conductive layer. The second interlayer insulating layer IL2 may cover or overlap the third conductive layer and protect the third conductive layer.

A fourth conductive layer may be disposed on the second interlayer insulating layer IL2. The fourth conductive layer may include a first voltage wiring VL1, a second voltage wiring VL2, and a first conductive pattern CDP. A high-potential voltage (or first power supply voltage) supplied to the first transistor T1 may be applied to the first voltage wiring VL1, and a low-potential voltage (or second power supply voltage) supplied to a second electrode RME2 may be applied to the second voltage wiring VL2.

The first conductive pattern CDP may be electrically connected to the second capacitive electrode CSE2 and may be electrically connected to the first transistor T1 through the second capacitive electrode CSE2. The first conductive pattern CDP may also electrically contact a first electrode RME1 described below, and the first transistor T1 may transmit the first power supply voltage received from the first voltage wiring VL1 to the first electrode RME1. Although the drawings illustrate that the fourth conductive layer includes a second voltage wiring VL2 and a first voltage wiring VL1, the disclosure is not limited thereto. The fourth conductive layer may also include a larger number of first voltage wirings VL1 and second voltage wirings VL2.

Each of the buffer layer BL, the first gate insulating layer GI, the first interlayer insulating layer IL1, and the second interlayer insulating layer IL2 described above may include inorganic layers stacked alternately. For example, each of the buffer layer BL, the first gate insulating layer GI, the first interlayer insulating layer ILL and the second interlayer insulating layer IL2 may be a double layer in which inorganic layers including at least one of silicon oxide ($SiO_x$), silicon nitride ($SiN_x$), and silicon oxynitride ($SiO_xN_y$) are stacked or may be a multilayer in which the inorganic layers are alternately stacked. However, the disclosure is not limited thereto, and each of the buffer layer BL, the first gate insulating layer GI, the first interlayer insulating layer IL1, and the second interlayer insulating layer IL2 may also be an inorganic layer including at least one of the above materials.

Each of the second conductive layer, the third conductive layer, and the fourth conductive layer may be, but is not limited to, a single layer or a multilayer made of one or more of molybdenum (Mo), aluminum (Al), chromium (Cr), gold (Au), titanium (Ti), nickel (Ni), neodymium (Nd), copper (Cu), and alloys thereof.

A third interlayer insulating layer IL3 may be disposed on the fourth conductive layer. The third interlayer insulating layer IL3 may include an organic insulating material, for example, an organic material such as polyimide (PI) and perform a surface planarization function.

First banks BNL1, first to fourth electrodes RME1 to RME4, the light emitting elements ED, first to third contact electrodes CNE1 to CNE3, and the second bank BNL2 may be disposed as the display element layer on the third interlayer insulating layer IL3. First to third insulating layers PAS1 to PAS3 may be disposed on the third interlayer insulating layer IL3.

The first banks BNL1 may be directly disposed on the third interlayer insulating layer IL3. The first banks BNL1 may include first subbanks BNL_A disposed in the emission area EMA of each subpixel PXn and a second subbank BNL_B extending in the second direction DR2 between the first subbanks BNL_A. The light emitting elements ED may be disposed in a space between the first and second subbanks BNL_A and BNL_B.

Parts of the first subbanks BNL_A may be disposed in the emission area EMA of each subpixel PXn and may be spaced apart from each other. For example, the first subbanks BNL_A may be spaced apart from each other in the first direction DR1 in each emission area EMA and may be disposed on a left side and a right side of a center of the emission area EMA. The first subbanks BNL_A may extend in the second direction DR2, but their lengths may be smaller than a length, in the second direction DR2, of an opening area, surrounded by the second bank BNL2. The first subbanks BNL_A may form linear patterns or island-shaped patterns extending in a direction in the entire display area DPA.

The second subbank BNL_B may be disposed between the first subbanks BNL_A and may extend in the second direction DR2. Unlike the first subbanks BNL_A, the second subbank BNL_B may extend in the second direction DR2 beyond the emission area EMA and the subarea SA to pixels PX neighboring in the second direction DR2. In an embodiment, the second subbank BNL_B may be wider than the first subbanks BNL_A, and the electrodes RME may be disposed on the second subbank BNL_B. The second subbank BNL_B may include a bank widened part BEP disposed in the subarea SA and having a greater width. The second subbank BNL_B may generally extend in the second direction DR2 but include parts having a large width to form a linear or stripe pattern in the display area DPA.

Although the drawings illustrate two first subbanks BNL_A and a second subbank BNL_B, the disclosure is not limited thereto. The number of first subbanks BNL_A disposed in the emission area EMA of each subpixel PXn may vary according to the number of the electrodes RME or the arrangement of the light emitting elements ED.

At least a part of each first bank BNL1 may protrude from an upper surface of the third interlayer insulating layer IL3. The protruding part of each first bank BNL1 may have inclined side surfaces, and light emitted from the light emitting elements ED may be reflected by the electrodes RME disposed on the first banks BNL1 to travel toward above the third interlayer insulating layer IL3. The first banks BNL1 may provide an area where the light emitting elements ED are disposed while functioning as reflective barriers that reflect light emitted from the light emitting elements ED in an upward direction. The side surfaces of the first banks BNL1 may be inclined in a linear shape. However, the disclosure is not limited thereto, and each of the first banks BNL1 may also have various shapes such as a semi-circle or a semi-ellipse with a curved outer surface. The first banks BNL1 may include an organic insulating material such as polyimide (PI). However, the disclosure is not limited thereto, and the first banks BNL1 may be omitted.

The electrodes RME may extend in a direction and may be spaced apart from each other in each subpixel PXn. For example, the first electrode RME1, the second electrode RME2, the third electrode RME3, and the fourth electrode RME4 may be disposed in a subpixel PXn, may extend in the second direction DR2, and may be spaced apart from each other in the first direction DR1. The electrodes RME may be disposed in the emission area EMA of each subpixel PXn, and parts of the electrodes RME may extend beyond the emission area EMA to overlap the second bank BNL2 in the thickness direction. The electrodes RME may extend in the second direction DR2 in each subpixel PXn but may be spaced apart in the subarea SA from the electrodes RME of another subpixel PXn in the second direction DR2.

The above arrangement of the electrodes RME may be obtained by forming electrode lines extending in the second direction DR2 and then separating the electrode lines in a subsequent process after the light emitting elements ED are placed. The electrode lines may be utilized to generate an electric field in each subpixel PXn to align the light emitting elements ED during a process of manufacturing the display device 10. For example, the light emitting elements ED may be sprayed onto the electrode lines by an inkjet printing process. When ink including the light emitting elements ED is sprayed onto the electrode lines, an electric field may be generated by transmitting alignment signals to the electrode lines. The light emitting elements ED dispersed in the ink may be placed on the electrodes RME by a dielectrophoretic force due to the generated electric field. After the light emitting elements ED are placed, the electrode lines may be partially separated to form the electrodes RME separate for each subpixel PXn.

Some of the electrodes RME may be directly connected to the fourth conductive layer to receive signals for causing the light emitting elements ED to emit light. For example, the first electrode RME1 may contact the first conductive pattern CDP through a first contact hole CT1 penetrating the third interlayer insulating layer IL3 disposed under the first electrode RME1. The second electrode RME2 may contact the second voltage wiring VL2 through a second contact hole CT2 penetrating the third interlayer insulating layer IL3 disposed under the second electrode RME2. The first electrode RME1 may be electrically connected to the first transistor T1 through the first conductive pattern CDP to receive the first power supply voltage, and the second electrode RME2 may be electrically connected to the second voltage wiring VL2 to receive the second power supply voltage. Although the first contact hole CT1 and the second contact hole CT2 are formed at positions overlapping the second bank BNL2 in the drawings, the disclosure is not limited thereto. For example, the contact holes CT1 and CT2 may also be located in the emission area EMA surrounded by the second bank BNL2.

The electrodes RME may be electrically connected to the light emitting elements ED. The electrodes RME may be electrically connected to the ends of the light emitting elements ED through the first to third contact electrodes CNE1 to CNE3 described below and may transmit an electrical signal received from the fourth conductive layer to the light emitting elements ED. Since the electrodes RME are disposed separately for each subpixel PXn, the light emitting elements ED of different subpixels PXn may emit light individually.

The first electrode RME1 and the fourth electrode RME4 may be partially disposed on the first subbanks BNL_A, and the second electrode RME2 and the third electrode RME3 may be partially disposed on the second subbank BNL_B. Each electrode RME may be disposed on a side of the first subbank BNL_A or the second subbank BNL_B in the first direction DR1 and may be disposed on an inclined side surface of the first subbank BNL_A or the second subbank BNL_B. Each electrode RME may be disposed to cover or overlap at least one side surface of a first subbank BNL_A or the second subbank BNL_B to reflect light emitted from the light emitting elements ED.

The first electrode RME1 and the fourth electrode RME4 may be disposed on different first subbanks BNL_A and may extend in the second direction DR2. The first electrode RME1 may be disposed on the first subbank BNL_A on the left side of the center of the emission area EMA, and the fourth electrode RME4 may be disposed on the first subbank BNL_A on the right side of the center of the emission area EMA. The first electrode RME1 may include an electrode contact part RM_C overlapping the first contact hole CT1 and an electrode part. The fourth electrode RME4 may be symmetrical to the first electrode RME1 excluding the electrode contact part RM_C with respect to the center of the emission area EMA, and the first electrode RME1 and the fourth electrode RME4 may be spaced apart from each other in the first direction DR1.

The second electrode RME2 and the third electrode RME3 may be disposed on both sides of the second subbank BNL_B in the first direction DR1, respectively, and may be spaced apart from each other. The second electrode RME2 may be spaced part from the fourth electrode RME4 in the first direction DR1 and disposed on a right side of the second subbank BNL_B, and the third electrode RME3 may be spaced apart from the first electrode RME1 in the first direction DR1 and disposed on a left side of the second subbank BNL_B. The second electrode RME2 may include an electrode contact part RM_C overlapping the second contact hole CT2 and the second bank BNL2. In contrast, the third electrode RME3 may not be directly electrically connected to the fourth conductive layer.

A gap between the electrodes RME in the first direction DR1 may be smaller than that between the first and second subbanks BNL_A and BNL_B. At least a part of each electrode RME may be directly disposed on the third interlayer insulating layer IL3 so that the electrodes RME may be disposed on the same plane or layer.

Each electrode RME may include a conductive material having high reflectivity. For example, each electrode RME may include a metal such as silver (Ag), copper (Cu), or aluminum (Al) as a material having high reflectivity or may be an alloy including aluminum (Al), nickel (Ni), or lanthanum (La). Each electrode RME may reflect light, which travels toward a side surface of a first bank BNL1 after being emitted from the light emitting elements ED, toward above each subpixel PXn.

However, the disclosure is not limited thereto, and each electrode RME may further include a transparent conductive material. For example, each electrode RME may include a material such as ITO, IZO, or ITZO. In some embodiments, each electrode RME may have a structure in which a transparent conductive material and a metal layer having high reflectivity are each stacked in one or more layers or may be formed as a single layer including the same. For example, each electrode RME may have a stacked structure of ITO/Ag/ITO, ITO/Ag/IZO, or ITO/Ag/ITZO/IZO.

The first insulating layer PAS1 may be entirely disposed on the third interlayer insulating layer IL3. For example, the first insulating layer PAS1 may cover or overlap the electrodes RME and the first banks BNL1. However, the first insulating layer PAS1 may include openings OP partially exposing upper surfaces of the electrodes RME, and the first to third contact electrodes CNE1 to CNE3 to be described below may contact the electrodes RME through the openings.

In an embodiment, the first insulating layer PAS1 may be stepped (or have height differences) such that a part of an upper surface of the first insulating layer PAS1 is recessed between the electrodes RME spaced apart from each other in the first direction DR1. Since the first insulating layer PAS1 overlaps the electrodes RME, the first insulating layer PAS1 may be stepped therebetween. The first insulating layer PAS1 may protect the electrodes RME and insulate them from each other. The first insulating layer PAS1 may prevent the light emitting elements ED disposed on the first insulating layer PAS1 from directly contacting other members and being damaged.

The second bank BNL2 may be disposed on the first insulating layer PAS1. The second bank BNL2 may include parts extending in the first direction DR1 and the second direction DR2 to form a lattice pattern in a plan view. The second bank BNL2 may be disposed at the boundary of each subpixel PXn to separate neighboring subpixels PXn. The second bank BNL2 may surround the emission area EMA and the subarea SA disposed in each subpixel PXn to separate the emission area EMA and the subarea SA from each other. Of the parts of the second bank BNL2 which extend in the second direction DR2, a part disposed between the emission areas EMA may be wider than a part disposed between the subareas SA. Accordingly, a gap between the subareas SA may be smaller than a gap between the emission areas EMA.

The second bank BNL2 may be formed to have a greater height than that of the first banks BNL1. The second bank BNL2 may prevent ink from overflowing into adjacent subpixels PXn in an inkjet printing process during the process of manufacturing the display device 10. Therefore, the second bank BNL2 may separate inks in which different light emitting elements ED are dispersed for different subpixels PXn, so that the inks are not mixed with each other. Since a first bank BNL1 is disposed over subpixels PXn neighboring in the first direction DR1, the parts of the second bank BNL2 which extend in the second direction DR2 may be partially disposed on the first bank BNL1. Similar to the first banks BNL1, the second bank BNL2 may include, but is not limited to, polyimide (PI).

The light emitting elements ED may be disposed on the first insulating layer PAS1. The light emitting elements ED may be spaced apart from each other in the second direction DR2 in which each electrode RME extends and may be aligned substantially parallel to each other. The light emitting elements ED may extend in a direction, and the direction in which each electrode RME extends and the direction in which the light emitting elements ED extend may be substantially perpendicular to each other. However, the disclosure is not limited thereto, and the light emitting elements ED may also extend obliquely to the direction in which each electrode RME extends.

Each light emitting element ED may include semiconductor layers doped with dopants of different conductivity types. Each light emitting element ED including the semiconductor layers may be oriented such that the end thereof faces in a specific direction according to the direction of an electric field generated on the electrodes RME. Each light emitting element ED may include a light emitting layer 36 (see FIG. 5) to emit light of a specific wavelength band. The light emitting elements ED disposed in each subpixel PXn may emit light of different wavelength bands according to a material that forms the light emitting layer 36. However, the disclosure is not limited thereto, and the light emitting elements ED disposed in each subpixel PXn may also emit light of the same color.

In each light emitting element ED, layers may be disposed in a direction parallel to an upper surface of the first substrate SUB1. The direction in which the light emitting elements ED of the display device 10 extend may be parallel to the first substrate SUB1, and semiconductor layers included in each light emitting element ED may be sequentially arranged in the direction parallel to the upper surface of the first substrate SUB1. However, the disclosure is not limited thereto. In some cases, in case that the light emitting elements ED have a different structure, the layers may be arranged in a direction perpendicular to the first substrate SUB1.

The light emitting elements ED may be disposed on each electrode RME between the first banks BNL1. A length of each light emitting element ED may be greater than the gap between the electrodes RME spaced apart from each other in the first direction DR1, and the ends of each light emitting element ED may be disposed on different electrodes RME, respectively. As will be described below, each light emitting element ED may include semiconductor layers, and a first end and a second end opposite the first end may be defined based on a semiconductor layer. The light emitting elements ED may be divided into different light emitting elements ED based on an electrode on which the first ends are disposed.

For example, the light emitting elements ED may include first light emitting elements ED1 each including a first end disposed on the first electrode RME1 and a second end disposed on the third electrode RME3 and second light emitting elements ED2 each including a first end disposed on the fourth electrode RME4 and a second end disposed on the second electrode RME2. The first light emitting elements ED1 may be disposed between the left first subbank BNL_A and the second subbank BNL_B such that both ends are disposed on the first electrode RME1 and the third electrode RME3. The second light emitting elements ED2 may be disposed between the right first subbank BNL_A and the second subbank BNL_B such that both ends of the second light emitting elements ED2 are disposed on the second electrode RME2 and the fourth electrode RME4. The light emitting elements ED disposed in a subpixel PXn may include the first and second light emitting elements ED1 and ED2 whose first ends face in opposite directions.

Both ends of each light emitting element ED may electrically contact the first to third contact electrodes CNE1 to CNE3. An insulating film 38 (see FIG. 5) may not be formed on end surfaces of each light emitting element ED in the extending direction of the light emitting element ED, thereby partially exposing the semiconductor layers. Therefore, the exposed semiconductor layers may electrically contact the first to third contact electrodes CNE1 to CNE3. However, the disclosure is not limited thereto. In some cases, at least a part of the insulating film 38 of each light emitting element ED may be removed to partially expose side surfaces of both ends of the semiconductor layers. The exposed side surfaces of the semiconductor layers may directly contact the first to third contact electrodes CNE1 to CNE3. Each light emitting element ED may be electrically connected to each electrode RME through a contact electrode CNE1, CNE2 or CNE3. The second ends of the first light emitting elements ED1 and the first ends of the second light emitting elements ED2 may be electrically connected to each other through the same contact electrode. Accordingly, the first light emitting elements ED1 and the second light emitting elements ED2 may be electrically connected in series to each other.

A second insulating layer PAS2 may be partially disposed on the first insulating layer PAS1 and the light emitting elements ED. The second insulating layer PAS2 may be disposed on the second bank BNL2 and in the subarea SA. For example, the second insulating layer PAS2 may partially surround an outer surface of each light emitting element ED not to cover or overlap the first end and the second end of the light emitting element ED. A part of the second insulating layer PAS2 may overlap the second subbank BNL_B and may be disposed on the first insulating layer PAS1. For example, the second insulating layer PAS2 may be disposed on the light emitting elements ED, the first insulating layer PAS1 and the second bank BNL2 in the emission area EMA and may expose a portion of parts where the electrodes RME are disposed as well as both sides of each light emitting element ED. The shape of the second insulating layer PAS2 may be obtained by entirely placing the second insulating layer PAS2 on the first insulating layer PAS1 and the second bank BNL2 during the process of manufacturing the display device 10 and then removing the second insulating layer PAS2 to expose the ends of each light emitting element ED.

Of the second insulating layer PAS2, parts disposed on the light emitting elements ED may extend in the second direction DR2 on the first insulating layer PAS1 in a plan view to form linear patterns or island-shaped patterns in each subpixel PXn. The second insulating layer PAS2 may protect the light emitting elements ED and fix the light emitting elements ED during the process of manufacturing the display device 10. The second insulating layer PAS2 may also fill a space between each light emitting element ED and the first insulating layer PAS1 disposed under the light emitting element ED.

During the process of manufacturing the display device 10, a process of separating the electrode lines in the subarea SA to form the electrodes RME may be performed after the second insulating layer PAS2 is formed. The second insulating layer PAS2 may be entirely disposed in the subarea SA and the emission area EMA but may be partially removed by the process of exposing both ends of each light emitting elements ED and the separation process. In the subarea SA, the first insulating layer PAS1 and the second insulating layer PAS2 may be removed from an area where the electrode lines are separated, and a third insulating layer PAS3 to be described below may be directly disposed on the third interlayer insulating layer IL3.

The first to third contact electrodes CNE1 to CNE3 and the third insulating layer PAS3 may be disposed on the second insulating layer PAS2. The first to third contact electrodes CNE1 to CNE3 may include a first contact electrode CNE1 and a second contact electrode CNE2 disposed on the same layer and a third contact electrode CNE3 disposed on a different layer from the first and second contact electrodes CNE1 and CNE2. The third insulating layer PAS3 may be disposed between the first and second contact electrodes CNE1 and CNE2 and the third contact electrode CNE3.

The first to third contact electrodes CNE1 to CNE3 may electrically contact the light emitting elements ED and the electrodes RME. The first to third contact electrodes CNE1 to CNE3 may directly contact the semiconductor layers exposed on both end surfaces of each light emitting element ED and may contact exposed parts of the upper surfaces of the electrodes RME on which the first insulating layer PAS1 is not disposed. Both ends of each light emitting element ED may be electrically connected to the electrodes RME through the first to third contact electrodes CNE1 to CNE3.

The first contact electrode CNE1 may be disposed on the first electrode RME1, and the second contact electrode CNE2 may be disposed on the second electrode RME2. The first contact electrode CNE1 may have a smaller width than that of the first electrode RME1 and may extend in the second direction DR2. The first contact electrode CNE1 may contact the first electrode RME1 exposed by the first insulating layer PAS1 and contact the first ends of the first light emitting elements ED1, and the first light emitting elements ED1 may be electrically connected to the first electrode RME1 through the first contact electrode CNE1.

The second contact electrode CNE2 may have a smaller width than that of the second electrode RME2 and may extend in the second direction DR2. The second contact electrode CNE2 may contact the second electrode RME2 exposed by the first insulating layer PAS1 and contact the second ends of the second light emitting elements ED2, and the second light emitting elements ED2 may be electrically connected to the second electrode RME2 through the second contact electrode CNE2.

Each of the first contact electrode CNE1 and the second contact electrode CNE2 may be directly disposed on the second insulating layer PAS2. The first contact electrode CNE1 and the second contact electrode CNE2 may have smaller widths than that of the electrodes RME and may form linear patterns extending in the second direction DR2 within the emission area EMA.

The third insulating layer PAS3 may be disposed on the first contact electrode CNE1 and the second contact electrode CNE2. The third insulating layer PAS3 may overlap the first contact electrode CNE1 and the second contact electrode CNE2, and a part of the third insulating layer PAS3 may also be disposed on the second insulating layer PAS2. In some embodiments, the third insulating layer PAS3 may be entirely disposed on the first insulating layer PAS1 except for parts of the third insulating layer PAS3 where the third contact electrode CNE3 is disposed on the electrodes RME. The third insulating layer PAS3 may insulate the first contact electrode CNE1 and the second contact electrode CNE2 from the third contact electrode CNE3 to prevent them from directly contacting each other. The third insulating layer PAS3 may be disposed between the first and second contact electrodes CNE1 and CNE2 and the third contact electrode CNE3 to insulate them from each other. However, in some embodiments, the third insulating layer PAS3 may be omitted. In this case, the first and second contact electrodes CNE1 and CNE2 and the third contact electrode CNE3 may be disposed on the same layer.

The third contact electrode CNE3 may include a first extending part CN_E1 disposed on the third electrode RME3, a second extending part CN_E2 disposed on the fourth electrode RME4, and connecting parts CN_B electrically connecting the first extending part CN_E1 and the second extending part CN_E2 to each other. The first extending part CN_E1 and the second extending part CN_E2 may have a substantially similar shape to the first contact electrode CNE1. The first extending part CN_E1 and the second extending part CN_E2 may have smaller widths than that of the third electrode RME3 and the fourth electrode RME4 and may extend in the second direction DR2. However, lengths of the first extending part CN_E1 and the second extending part CN_E2 measured in the second direction DR2 may be greater than a length of the first contact electrode CNE1, and the first extending part CN_E1 and the second extending part CN_E2 may be electrically connected to each other through the connecting parts CN_B extending in the first direction DR1. The third contact electrode CNE3 may surround the second contact electrode CNE2 in a plan view.

The first extending part CN_E1 and the second extending part CN_E2 may electrically contact the third electrode RME3 and the fourth electrode RME4, respectively. The first extending part CN_E1 of the third contact electrode CNE3 may electrically contact the second ends of the first light emitting elements ED1, and the second extending part CN_E2 may electrically contact the first ends of the second light emitting elements ED2. The first light emitting elements ED1 and the second light emitting elements ED2 may be electrically connected in series to each other through the third contact electrode CNE3.

The first to third contact electrodes CNE1 to CNE3 may include a conductive material such as ITO, IZO, ITZO, or aluminum (Al). For example, the first to third contact electrodes CNE1 to CNE3 may include a transparent conductive material, and light emitted from the light emitting elements ED may pass through the first to third contact electrodes CNE1 to CNE3 and proceed toward the first and second electrodes RME1 and RME2, but the disclosure is not limited thereto.

Although not illustrated in the drawings, an insulating layer may be further disposed on the second insulating layer PAS2, the third insulating layer PAS3, and the first to third contact electrodes CNE1 to CNE3 to overlap them. The insulating layer may be entirely disposed on the first substrate SUB1 to protect the members disposed on the first substrate SUB1 from the external environment.

Each of the first insulating layer PAS1, the second insulating layer PAS2, and the third insulating layer PAS3 described above may include an inorganic insulating material or an organic insulating material. In an embodiment, each of the first insulating layer PAS1, the second insulating layer PAS2, and the third insulating layer PAS3 may include an inorganic insulating material such as silicon oxide ($SiO_x$), silicon nitride ($SiN_x$), silicon oxynitride ($SiO_xN_y$), aluminum oxide ($AlO_x$), or aluminum nitride ($AlN_x$). As another example, each of the first insulating layer PAS1, the second insulating layer PAS2, and the third insulating layer PAS3 may include an organic insulating material such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, or polymethyl methacrylate-polycarbonate synthetic resin. However, the disclosure is not limited thereto.

Figure 5:
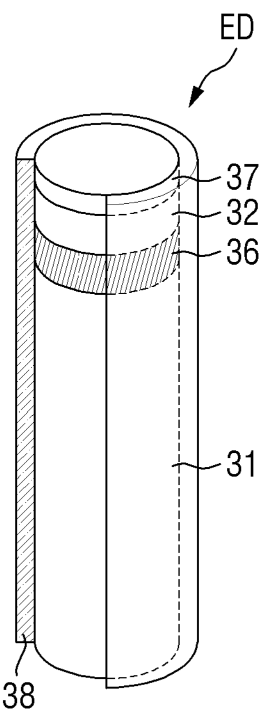
FIG. 5 is a schematic view of a light emitting element according to an embodiment.

FIG. 5 is a schematic view of a light emitting element ED according to an embodiment.

The light emitting element ED may be a light emitting diode. The light emitting element ED may be an inorganic light emitting diode having a size of micrometers to nanometers and be made of (or include) an inorganic material. In case that an electric field is formed in a specific direction between two electrodes facing each other, the inorganic light emitting diode may be aligned between the two electrodes in which polarities are formed. The light emitting element ED may be aligned between the electrodes by the electric field formed on the two electrodes.

The light emitting element ED according to the embodiment may extend in a direction. The light emitting element ED may have the shape of a cylinder, a rod, a wire, a tube, or the like. However, the shape of the light emitting element ED is not limited thereto, and the light emitting element ED may also have various shapes including polygonal prisms, such as a cube, a rectangular parallelepiped, and a hexagonal prism, and a shape extending in a direction and having a partially inclined outer surface. Semiconductors included in the light emitting element ED which will be described below may be sequentially disposed or stacked in the direction.

The light emitting element ED may include a semiconductor layer doped with impurities of any conductivity type (e.g., a p-type or an n-type). The semiconductor layer may receive an electrical signal from an external power source and emit light of a specific wavelength band.

Referring to FIG. 5, the light emitting element ED may include a first semiconductor layer 31, a second semiconductor layer 32, the light emitting layer 36, an electrode layer 37, and the insulating film 38.

The first semiconductor layer 31 may be an n-type semiconductor. In case that the light emitting element ED emits light in a blue wavelength band, the first semiconductor layer 31 may include a semiconductor material having a chemical formula of $Al_xGa_yIn_{1-x-y}N$ ($0 \le x \le 1$, $0 \le y \le 1$, $0 \le x+y \le 1$). For example, the first semiconductor layer 31 may be one or more of n-type doped AlGaInN, GaN, AlGaN, InGaN, AlN, and InN. The first semiconductor layer 31 may be doped with an n-type dopant, and the n-type dopant may be Si, Ge, Sn, or the like. For example, the first semiconductor layer 31 may be n-GaN doped with n-type Si. A length of the first semiconductor layer 31 may be in the range of, but not limited to, about 1.5 μm to about 5 μm. The first end of the light emitting element ED may be a part in which the first semiconductor layer 31 is disposed with respect to the light emitting layer 36.

The second semiconductor layer 32 may be disposed on the light emitting layer 36 to be described below. The second semiconductor layer 32 may be a p-type semiconductor. In case that the light emitting element ED emits light in a blue or green wavelength band, the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be one or more of p-type doped AlGaInN, GaN, AlGaN, InGaN, AlN, and InN. The second semiconductor layer 32 may be doped with a p-type dopant, and the p-type dopant may be Mg, Zn, Ca, Se, Ba, or the like. For example, the second semiconductor layer 32 may be p-GaN doped with p-type Mg. A length of the second semiconductor layer 32 may be in the range of, but not limited to, about 0.05 μm to about 0.10 μm. The second end of the light emitting element ED may be a part in which the second semiconductor layer 32 is disposed with respect to the light emitting layer 36.

Although each of the first semiconductor layer 31 and the second semiconductor layer 32 is formed as a layer in the drawing, the disclosure is not limited thereto. Each of the first semiconductor layer 31 and the second semiconductor layer 32 may further include a larger number of layers, for example, a clad layer or a tensile strain barrier reducing (TSBR) layer depending on the material of the light emitting layer 36.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, the light emitting layer 36 may have a structure in which quantum layers and well layers are alternately stacked. The light emitting layer 36 may emit light through combination of electron-hole pairs according to an electrical signal received through the first semiconductor layer 31 and the second semiconductor layer 32. For example, in case that the light emitting layer 36 emits light in the blue wavelength band, the light emitting layer 36 may include a material such as AlGaN or AlGaInN. In particular, in case that the light emitting layer 36 has a multiple quantum well structure in which a quantum layer and a well layer are alternately stacked, the quantum layer may include a material such as AlGaN or AlGaInN, and the well layer may include a material such as GaN or AMIN. For example, the light emitting layer 36 may include AlGaInN as a quantum layer and AlInN as a well layer to emit blue light having a central wavelength band of about 450 nm to about 495 nm.

However, the disclosure is not limited thereto, and the light emitting layer 36 may also have a structure in which a semiconductor material having a large band gap energy and a semiconductor material having a small band gap energy are alternately stacked or may include different group III to V semiconductor materials depending on the wavelength band of emitted light. Light emitted from the light emitting layer 36 is not limited to light in the blue wavelength band. In some cases, the light emitting layer 36 may emit light in a red or green wavelength band. A length of the light emitting layer 36 may be in the range of, but not limited to, about 0.05 μm to about 0.10 μm.

Light emitted from the light emitting layer 36 may be emitted not only to an outer surface of the light emitting element ED in a longitudinal direction but also to both side surfaces. For example, the direction of the light emitted from the light emitting layer 36 is not limited to a direction The electrode layer 37 may be an ohmic contact electrode. However, the disclosure is not limited thereto, and the electrode layer 37 may also be a Schottky contact electrode. The light emitting element ED may include at least one electrode layer 37. Although the light emitting element ED includes an electrode layer 37 in FIG. 5, the disclosure is not limited thereto. In some cases, the light emitting element ED may include more electrode layers 37, or the electrode layer 37 may be omitted. The following description of the light emitting element ED may be applied equally even if the number of electrode layers 37 is changed or other structures are further included.

In case that the light emitting element ED is electrically connected to an electrode or a contact electrode in the display device 10 according to the embodiment, the electrode layer 37 may reduce the resistance between the light emitting element ED and the electrode or the contact electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), and indium tin zinc oxide (ITZO). The electrode layer 37 may include, but is not limited to, an n-type or p-type doped semiconductor material.

The insulating film 38 may surround outer surfaces of the semiconductor layers and the electrode layers described above. For example, the insulating film 38 may surround an outer surface of at least the light emitting layer 36 and extend in the direction in which the light emitting element ED extends. The insulating film 38 may protect the above members. The insulating film 38 may surround side surfaces of the above members but may expose both ends of the light emitting element ED in the longitudinal direction.

In the drawing, the insulating film 38 may extend in the longitudinal direction of the light emitting element ED to cover or overlap surfaces from side surfaces of the first semiconductor layer 31 to side surfaces of the electrode layer 37. However, the disclosure is not limited thereto, and the insulating film 38 may also cover outer surfaces of only some semiconductor layers as well as the light emitting layer 36 or may cover only a part of an outer surface of the electrode layer 37 to partially expose the outer surface of each electrode layer 37. As another example, an upper surface of the insulating film 38 may be rounded in cross section in an area adjacent to at least one end of the light emitting element ED.

A thickness of the insulating film 38 may be in the range of, but not limited to, about 10 nm to about 1.0 μm. The thickness of the insulating film 38 may be about 40 nm.

The insulating film 38 may include a material having insulating properties, such as silicon oxide ($SiO_x$), silicon nitride ($SiN_x$), silicon oxynitride ($SiO_xN_y$), aluminum nitride ($AlN_x$), or aluminum oxide ($AlO_x$). Although the insulating film 38 is illustrated as a single layer in the drawing, the disclosure is not limited thereto. In some embodiments, the insulating film 38 may be formed in a multilayer structure in which multiple layers are stacked. Accordingly, the insulating film 38 may prevent an electrical short circuit that may occur in case that the light emitting layer 36 directly contacts an electrode that transmits an electrical signal to the light emitting element ED, Since the insulating film 38 protects the outer surface of the light emitting element ED including the light emitting layer 36, a reduction in luminous efficiency may be prevented.

An outer surface of the insulating film 38 may be treated. Light emitting elements ED may be sprayed onto electrodes in a state where they are dispersed in a predetermined ink and then may be aligned. Here, the surface of the insulating film 38 may be hydrophobic- or hydrophilic-treated so that each light emitting element ED remains separate from other adjacent light emitting elements ED in the ink without being agglomerated with them. For example, the outer surface of the insulating film 38 may be treated with a material such as stearic acid or 2,3-naphthalene dicarboxylic acid.

A length of the light emitting element ED may be in the range of about 1 μm to about 10 μm or about 2 μm to about 6 μm and may be in the range of about 3 μm to about 5 μm. A diameter of the light emitting element ED may be in the range of about 30 nm to about 700 nm, and an aspect ratio of the light emitting element ED may be about 1.2 to about 100. However, the disclosure is not limited thereto, and light emitting elements ED included in the display device 10 may also have different diameters according to a difference in the composition of the light emitting layer 36. The diameter of the light emitting element ED may be about 500 nm.

Figure 6:
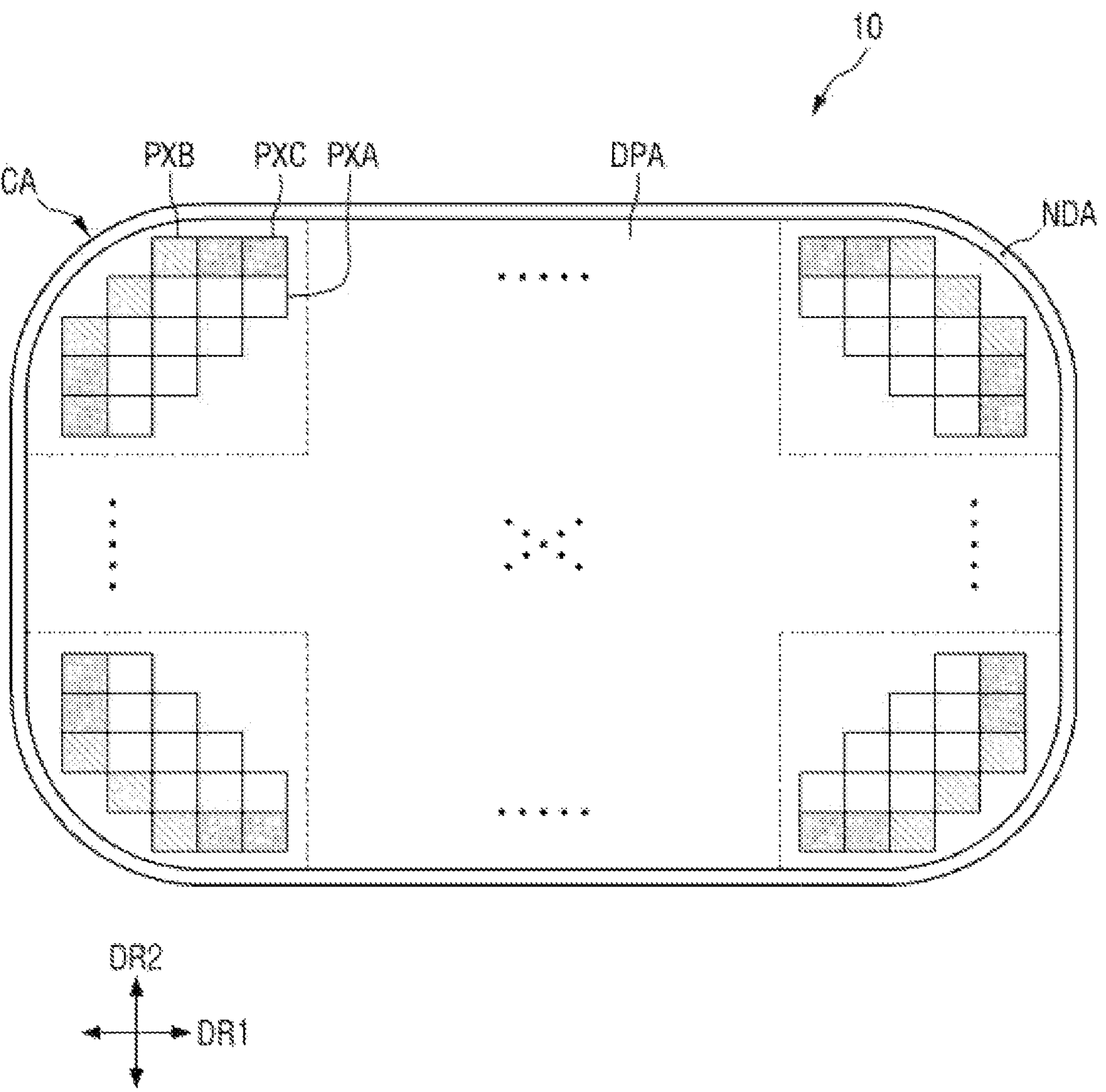
FIG. 6 is a schematic plan view illustrating the schematic arrangement of pixels adjacent to each corner of the display device according to an embodiment.
Figure 7:
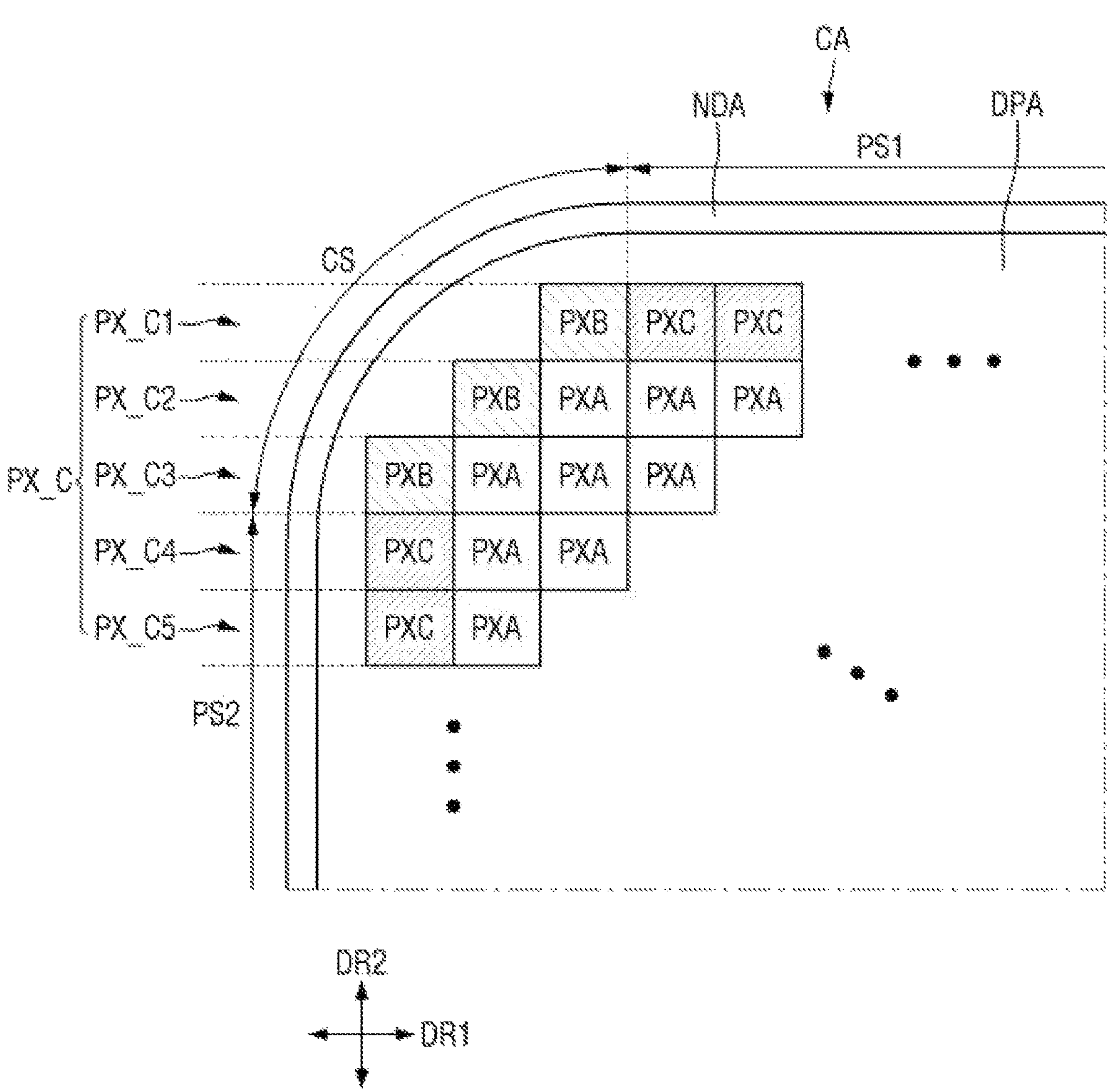
FIG. 7 is a schematic enlarged view illustrating the arrangement of pixels in a corner of FIG. 6.

FIG. 6 is a schematic plan view illustrating the schematic arrangement of pixels adjacent to each corner CA of the display device 10 according to the embodiment. FIG. 7 is a schematic enlarged view illustrating the arrangement of pixels in a corner CA of FIG. 6. FIGS. 6 and 7 illustrate the schematic shape of the display area DPA of the display device 10 and the relative arrangement of pixels PX (PXA, PXB, PXC) in the display area DPA. Although only three pixel rows PX_C are illustrated in FIG. 7 as pixels PX arranged in a corner CA of the display area DPA, there may be a greater number of pixels PX arranged to correspond to the corner CA.

Referring to FIGS. 6 and 7, in the display device 10 according to the embodiment, the corners CA where the long sides extending in the first direction DR1 and the short sides extending in the second direction DR2 meet each other may be curved. Accordingly, the corners CA of each of the display area DPA and the non-display area NDA may also be curved. Each of the display area DPA and the non-display area NDA may include a first side PS1 extending in the first direction DR1, a second side PS2 extending in the second direction DR2, and a curved outer side CS of each corner CA connecting the first side PS1 and the second side PS2.

The pixels PX and the subpixels PXn described above with reference to FIGS. 2 and 3 may be disposed in the display area DPA and may be arranged in the first direction DR1 and the second direction DR2. The curved corners CA of the display area DPA may not have sufficient space to place the pixels PX arranged in the first direction DR1 and the second direction DR2. Accordingly, each corner CA may include pixel rows or pixel columns including different numbers of pixels PX. For example, in the display area DPA, a first pixel row PX_C1, a second pixel row PX_C2, and a third pixel row PX_C3 may be arranged along the curved outer side CS as pixel rows PX_C corresponding to each corner CA. A fourth pixel row PX_C4 and a fifth pixel row PX_C5 may be arranged along the second side PS2 of the display area DPA. Since the outer side CS of each corner CA is curved, different numbers of pixels PX may be arranged in the first direction DR1 in the first to third pixel rows PX_C1 to PX_C3. The number of pixels PX included in the first pixel row PX_C1 disposed adjacent to the first side PS1 may be smaller than the number of pixels PX included in the second pixel row PX_C2. The number of pixels PX included in the second pixel row PX_C2 may be smaller than the number of pixels PX included in the third pixel row PX_C3. The numbers of pixels PX included in the fourth pixel row PX_C4 and the fifth pixel row PX_C5 arranged to correspond to the second side PS2 may be equal to the number of pixels PX included in the third pixel row PX_C3.

The display device 10 according to the embodiment may include, as the pixels PX arranged in the display area DPA, first-type pixels PXA which are arranged in an inner part of the display area DPA and second-type pixels PXB and third-type pixels PXC which are outermost pixels disposed adjacent to the boundary between the display area DPA and the non-display area NDA. The second-type pixels PXB are pixels PX disposed in an outermost part of the display area DPA and may be disposed in each corner CA of the display area DPA. The third-type pixels PXC may also be pixels PX disposed in the outermost part of the display area DPA and may be disposed to correspond to the first side PS1 and the second side PS2 of the display area DPA. The first-type pixels PXA may be pixels PX surrounded by the second-type pixels PXB and the third-type pixels PXC and may be disposed inside the outermost pixels. For example, the first pixel row PX_C1 may include outermost pixels of the display area DPA, and thus the second-type pixels PXB and the third-type pixels PXC may be arranged in the first pixel row PX_C1. The second-type pixels PXB and the first-type pixels PXA may be arranged in the second pixel row PX_C2 and the third pixel row PX_C3, and the third-type pixels PXC and the first-type pixels PXA may be arranged in the fourth pixel row PX_C4 and the fifth pixel row PX_C5.

As described above with reference to FIG. 2, each of the first to third-type pixels PXA to PXC may include subpixels PXn. Each of the subpixels PXn may include electrodes RME and light emitting elements ED to emit light of a specific wavelength band. However, different types of pixels PXA to PXC may be different in the structure of each subpixel PXn in addition to their position.

Each first-type pixel PXA may include the first subpixel PX1, the second subpixel PX2, and the third subpixel PX3 as illustrated in FIG. 2, and the subpixels PXn may have the same structure. The subpixels PXn of each first-type pixel PXA may have a uniform number of light emitting elements ED and the emission areas EMA having substantially the same area. In the case of the first-type pixels PXA disposed in the inner part of the display area DPA, the area of the emission area EMA and the number of light emitting elements ED may be substantially uniform between the first-type pixels PXA and between the subpixels PXn.

Similar to the first-type pixels PXA, each of the third-type pixels PXC may include the first subpixel PX1, the second subpixel PX2, and the third subpixel PX3 illustrated in FIG. 2. The third-type pixels PXC may be identical to the first-type pixels PXA except that they are located in the outermost part of the display area DPA. For example, similar to the subpixels PXn of each first-type pixel PXA, the subpixels PXn of each third-type pixel PXC may have a uniform number of light emitting elements ED and the emission areas EMA having substantially the same area. In the case of the third-type pixels PXC disposed in the outer part of the display area DPA, the area of the emission area EMA and the number of light emitting elements ED may be substantially uniform between the first-type pixels PXA or between third-type pixels PXC and between the subpixels PXn.

Each subpixel PXn of each pixel PX may include the emission area EMA and light emitting elements ED disposed in the emission area EMA. Each subpixel PXn may include electrodes RME and be connected to the circuit layer disposed under the electrodes RME so that the light emitting elements ED may emit light. In case that each of the light emitting elements ED emits light, a subpixel PXn in which the light emitting elements ED are disposed may emit light from the whole of at least the emission area EMA, and the luminance of the subpixel PXn may be related to the area of the emission area EMA, the number of light emitting elements ED, and the intensity of a driving signal. For example, in case that a driving signal of a uniform intensity is transmitted to each subpixel PXn, the larger the number of light emitting elements ED per unit area of the emission area EMA, the higher the luminance of the subpixel PXn, and the smaller the number of light emitting elements ED, the lower the luminance of the subpixel PXn. Similarly, in case that the number of light emitting elements ED is the same, the larger the area of the emission area EMA, the higher the luminance of the subpixel PXn, and the smaller the area of the emission area EMA, the lower the luminance of the subpixel PXn. For example, in an embodiment in which driving signals of the same intensity are applied to pixels PX, the subpixels PXn may have different luminances in case that they are different in the number of light emitting elements ED per unit area of the emission area EMA.

Here, the phrase "the number of light emitting elements ED per unit area of the emission area EMA" may mean, but is not limited to, the number of light emitting elements ED disposed in the emission area EMA surrounded by the second bank BNL2. As described above, the light emitting elements ED may be electrically connected to the electrodes RME and may emit light by receiving an electrical signal from the circuit layer disposed under the electrodes RME. Each subpixel PXn may have a luminance because of light emitting elements ED electrically connected to the electrodes RME and capable of emitting light among the light emitting elements ED disposed in the emission area EMA, and different pixels PX may have a relative difference in luminance according to the number of light emitting elements ED electrically connected to the electrodes RME.

For example, the phrase "the number of light emitting elements ED per unit area of the emission area EMA" for determining the relative distance between different pixels PX may also mean the number of light emitting elements ED electrically connected to the electrodes RME in the emission area EMA. However, if the ratio of the number of light emitting elements ED connected to the electrodes RME to the number of light emitting elements ED disposed in the emission area EMA is uniform between different pixels PX, the relative proportion of the number of light emitting elements ED disposed in the emission area EMA and the relative proportion of the number of light emitting elements ED electrically connected to the electrodes RME in the emission area EMA may be substantially the same between different pixels PX. In the specification, the phrase "the number of light emitting elements ED is the same or uniform" or "the area of the emission area EMA is the same or uniform" may mean that the number or size may be exactly the same or may be different within a predetermined error range. In contrast, the phrase "the number of light emitting elements ED is not the same or uniform" or "the area of the emission area EMA is not the same or uniform" (or is "different") may mean that the number or size may be obviously different outside the error range. For example, in the specification, the phrase "the area of the emission area EMA or the number of light emitting elements ED is not the same or uniform" may mean that there is a significant difference in comparison with a specific object.

In the display device 10 according to the embodiment, the second-type pixels PXB, which are outermost pixels disposed in each corner CA of the display area DPA, may be different from the first-type pixels PXA in the area of the emission area EMA or the number of light emitting elements ED in each subpixel PXn. In each corner CA of the display area DPA, it may be difficult to secure sufficient space to place the pixels PX arranged in the first direction DR1 and the second direction DR2, and the pixel rows PX_C arranged in the corner CA may have different numbers of pixels PX. Accordingly, a boundary formed by the second-type pixels PXB arranged along the curved outer side CS of each corner CA among the pixel rows PX_C including different pixels PX may be distinguished from the non-display area NDA and may be visually recognized. As described above, the boundary made visually recognizable by the second-type pixels PXB may be prevented from being visually recognized by fading the outermost part of the display area DPA by adjusting the luminances of the second-type pixels PXB.

To prevent outermost pixels in each corner CA of the display area DPA from being visually recognized, the display device 10 according to the embodiment may include the second-type pixels PXB which are different from the first-type pixels PXA in the number of light emitting elements ED and the area of the emission area EMA, or in the number of light emitting elements ED per unit area of the emission area EMA. The second-type pixels PXB may be different from the first-type pixels PXA or the third-type pixels PXC in the number of light emitting elements ED or the area of the emission area EMA and may be different in luminance despite driving signals of the same intensity. In the display area DPA, each corner CA where the second-type pixels PXB are disposed may be faded because its luminance is lower than that of the display area DPA inside the corner CA where the first-type pixels PXA are disposed, and visual recognition of the boundary formed by the second-type pixels PXB may be reduced or minimized. The relationship between the first-type pixels PXA and the second-type pixels PXB will be described in more detail with reference to other drawings.

Figure 8:
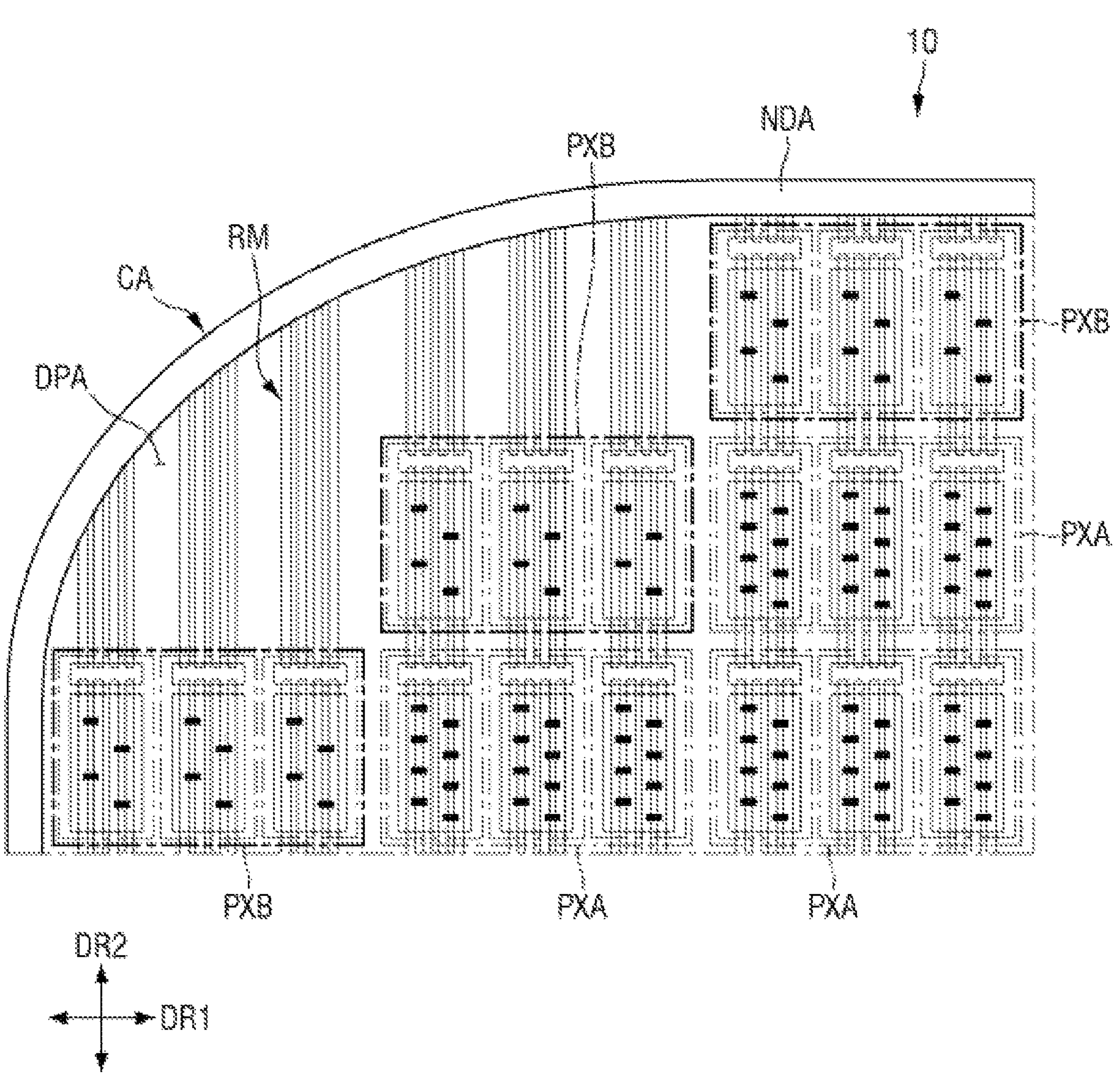
FIG. 8 is a schematic plan view illustrating the arrangement of different types of pixels disposed in a display area of the display device according to the embodiment.

FIG. 8 is a schematic plan view illustrating the schematic arrangement of different types of pixels disposed in the display area DPA of the display device 10 according to the embodiment. FIG. 8 illustrates only some first-type pixels PXA and some second-type pixels PXB as pixels PX disposed adjacent to a corner CA of the display area DPA. In order to compare and describe the relative difference between the first-type pixels PXA and the second-type pixels PXB, the arrangement of the subpixels PXn included in each pixel PX may be schematically illustrated. In each subpixel PXn, only the electrodes RME and the light emitting elements ED are shown, and only the second bank BNL2 is shown to show the emission area EMA and the subarea SA of the subpixel PXn.

In particular, the number of light emitting elements ED shown in each subpixel PXn of each pixel PX may be only intended to illustrate the relative difference between different pixels PX or different subpixels PXn and may not mean the actual number of light emitting elements ED disposed in the subpixel PXn. For example, although eight light emitting elements ED are disposed in each subpixel PXn of each first-type pixel PXA in the drawing, the number of light emitting elements ED disposed in the subpixel PXn is not limited to eight, and a larger or smaller number of light emitting elements ED may also be disposed. If the numbers of light emitting elements ED shown in different subpixels PXn are equal, it may mean that the subpixels PXn include substantially the same number of light emitting elements ED. In contrast, if the numbers of light emitting elements ED shown in different subpixels PXn are different, it may mean that one of the subpixels PXn includes more light emitting elements ED than that of the other subpixel PXn. For example, the number of light emitting elements ED may mean only an approximate ratio between light emitting elements ED disposed in different pixels PX or subpixels PXn but does not mean an exact number.

Referring to FIG. 8 in addition to FIGS. 6 and 7, electrodes RME extending in the second direction DR2 may be disposed in the display area DPA of the display device 10 as described above. The electrodes RME may be formed by forming electrode lines RM extending in the second direction DR2 and then separating the electrode lines RM in the subarea SA of each subpixel PXn after the light emitting elements ED are placed. Each of the second-type pixels PXB disposed in the outermost part of the display area DPA may also include the electrodes RME separated from the electrode lines RM in the subarea SA, and the electrode lines RM separated from the electrodes RME in the subarea SA may be disposed in the display area DPA between the second-type pixels PXB and the non-display area NDA. The electrode lines RM may also be disposed in the non-display area NDA and be connected to wirings disposed in the non-display area NDA. The second bank BNL2 surrounding the emission area EMA and the subarea SA of each subpixel PXn may also be disposed in the display area DPA between the second-type pixels PXB and the non-display area NDA, and the electrode lines RM may be covered or overlapped by the second bank BNL2. The electrode lines RM disposed in the outermost part of the display area DPA may not be visually recognized from the outside because of the second bank BNL2.

The display device 10 according to the embodiment may include the second-type pixels PXB which are disposed in the outermost part of the display area DPA and include a smaller number of light emitting elements ED than that of the first-type pixels PXA disposed in the inner part of the display area DPA. The number of light emitting elements ED disposed in each subpixel PXn of each second-type pixel PXB may be smaller than that of light emitting elements ED disposed in each subpixel PXn of each first-type pixel PXA. The second-type pixels PXB may be structurally the same as that of the first-type pixels PXA except that they include a smaller number of light emitting elements ED than that of the first-type pixels PXA and are disposed in the outermost part of the display area DPA along the corner CA.

The second-type pixels PXB may be the same as the first-type pixels PXA in the area of the emission area EMA but may include a smaller number of light emitting elements ED than that of the first-type pixels PXA. For example, the second-type pixels PXB may include a smaller number of light emitting elements ED per unit area of the emission area EMA than that of the first-type pixels PXA. The subpixels PXn of each second-type pixel PXB may include a uniform number of light emitting elements ED. In case that the display device 10 is driven, even if a driving signal of the same intensity is transmitted to each pixel PX regardless of the type of the pixel PX, a difference in luminance may not occur between the subpixels PXn of each second-type pixel PXB but may occur between the first-type pixels PXA and the second-type pixels PXB due to a difference in the number of light emitting elements ED.

The second-type pixels PXB disposed in the outermost part of the display area DPA along the corner CA may have a lower luminance than that of the first-type pixels PXA disposed in the inner part of the display area DPA, and the outermost part of the display area DPA may be faded from the second-type pixels PXB toward the non-display area NDA. Accordingly, in the display device 10, boundaries of the pixels PX in the corner CA of the display area DPA may be prevented from being visually recognized.

In the drawing, each first-type pixel PXA may include eight light emitting elements ED in each subpixel PXn, whereas each second-type pixel PXB may include four light emitting elements ED in each subpixel PXn. This may only mean that the first-type pixels PXA and the second-type pixels PXB include different numbers of light emitting elements ED but may not mean the exact number of light emitting elements ED disposed in each subpixel PXn.

A method of adjusting the luminance of each second-type pixel PXB to fade the corner CA of the display area DPA may be modified in various ways. In FIG. 8, a case where the number of light emitting elements ED varies is illustrated. However, the disclosure is not limited thereto, and the outermost part of the display area DPA may be faded by adjusting the area of the emission area EMA, the structure of each second-type pixel PXB, or the like.

Other embodiments of the display device 10 will hereinafter be described with reference to other drawings.

Figure 9:
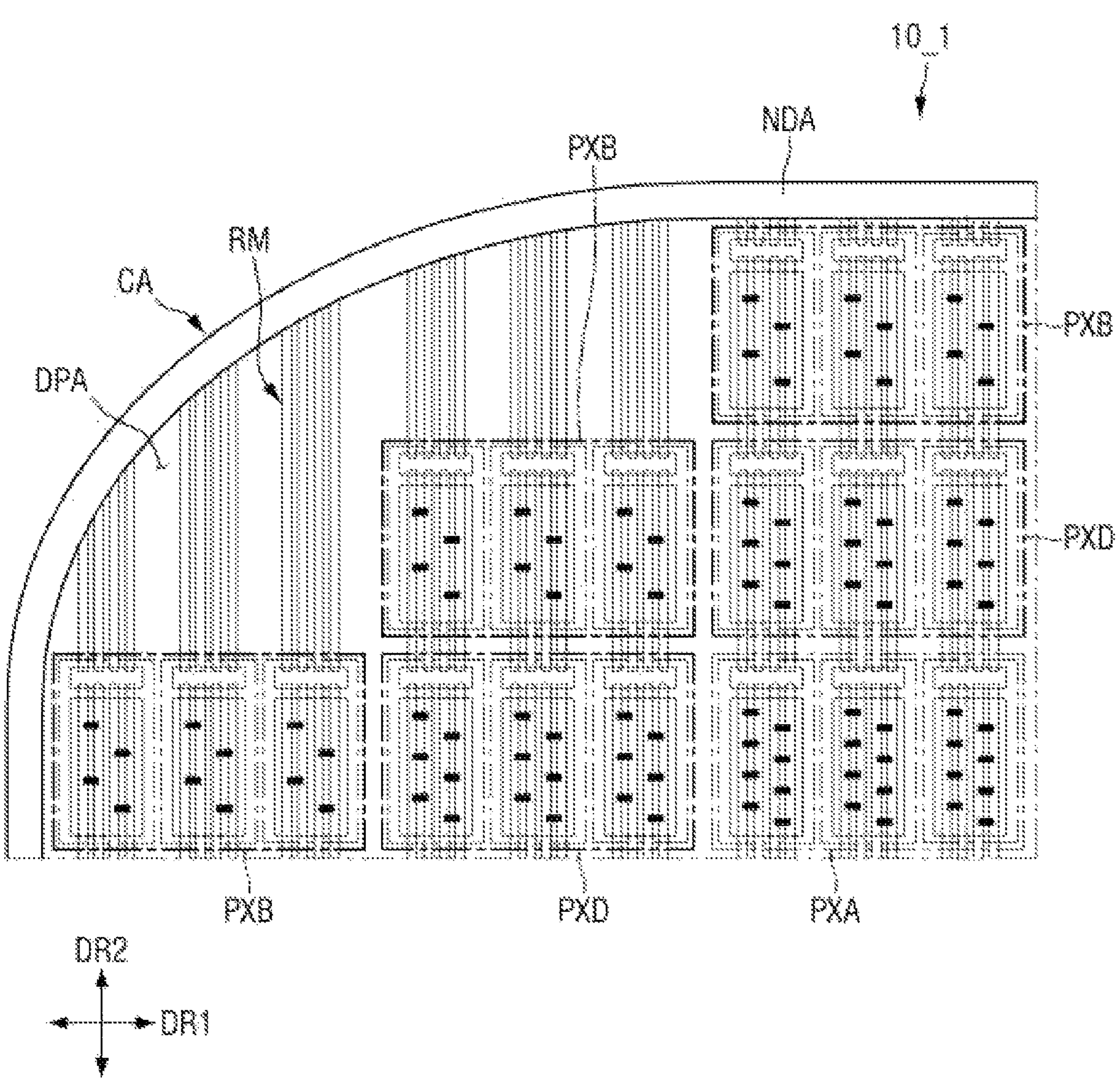
FIG. 9 is a schematic plan view illustrating the arrangement of different types of pixels disposed in a display area of a display device according to an embodiment.

FIG. 9 is a schematic plan view illustrating the schematic arrangement of different types of pixels disposed in a display area DPA of a display device 10_1 according to an embodiment.

Similar to FIG. 8, FIG. 9 illustrates only some first-type pixels PXA and some second-type pixels PXB disposed adjacent to a corner CA of the display area DPA. In order to compare and describe the relative difference between the first-type pixels PXA and the second-type pixels PXB, the arrangement of subpixels PXn included in each pixel PX is schematically illustrated. In the following other drawings, the structure of each pixel PX will also be schematically illustrated and described in order to compare the relative difference between some pixels PX adjacent to the corner CA of the display area DPA.

Referring to FIG. 9, the display device 10_1 according to the embodiment may further include fourth-type pixels PXD neighboring the second-type pixels PXB or the third-type pixels PXC, which are outermost pixels PX, and the first-type pixels PXA may be surrounded by the fourth-type pixels PXD. The fourth-type pixels PXD may be next outermost pixels, and the first-type pixels PXA may be inner pixels. This embodiment may be different from the embodiment of FIG. 8 at least in that some of the first-type pixels PXA which neighbor the outermost pixels are replaced with the fourth-type pixels PXD. Since the first-type pixels PXA, the second-type pixels PXB, and the third-type pixels PXC are the same as those described above, repetitive descriptions thereof will be omitted, and the fourth-type pixels PXD will be mainly described below.

The fourth-type pixels PXD may be arranged in an outer part of the display area DPA along the outermost pixels PX. The fourth-type pixels PXD may neighbor the third-type pixels PXC in the first direction DR1 or the second direction DR2 in parts corresponding to a first side PS1 and a second side PS2 and may neighbor the second-type pixels PXB in the first direction DR1 or the second direction DR2 in a part corresponding to a curved outer side CS of the corner CA.

The first-type pixels PXA may be disposed inside the outer part of the display area DPA in which the fourth-type pixels PXD are arranged.

Each subpixel PXn of each fourth-type pixel PXD may have substantially the same structure as that of each subpixel PXn of each first-type pixel PXA but may include a different number of light emitting elements ED in an emission area EMA. According to an embodiment, the number of light emitting elements ED disposed in each subpixel PXn of each fourth-type pixel PXD may be different from the number of light emitting elements ED disposed in each subpixel PXn of each first-type pixel PXA and each second-type pixel PXB. For example, the subpixels PXn of each fourth-type pixel PXD may include the same number of light emitting elements ED, and each subpixel PXn of each fourth-type pixel PXD may include a smaller number of light emitting elements ED than that of each subpixel PXn of each first-type pixel PXA but may include a larger number of light emitting elements ED than that of each subpixel PXn of each second-type pixel PXB. The fourth-type pixels PXD may be the same as the first-type pixels PXA and the second-type pixels PXB in the area of the emission area EMA but may include a smaller number of light emitting elements ED than that of the first-type pixels PXA. For example, the fourth-type pixels PXD may include a smaller number of light emitting elements ED per unit area of the emission area EMA than that of the first-type pixels PXA.

In case that the display device 10_1 is driven, even if a driving signal of the same intensity is transmitted to each pixel PX regardless of the type of the pixel PX, a difference in luminance may not occur between the subpixels PXn of each fourth-type pixel PXD but may occur between the first-type pixels PXA and the fourth-type pixels PXD due to a difference in the number of light emitting elements ED. Similarly, the fourth-type pixels PXD may include a larger number of light emitting elements ED than that of the second-type pixels PXB, and a difference in luminance may occur between the second-type pixels PXB and the fourth-type pixels PXD due to a difference in the number of light emitting elements ED.

The second-type pixels PXB disposed in an outermost part of the display area DPA along the corner CA may have a lower luminance than that of the fourth-type pixels PXD disposed in a next outermost part of the display area DPA, and the fourth-type pixels PXD may have a lower luminance than that of the first-type pixels PXA disposed in an inner part of the display area DPA. In the corner CA, the display area DPA may be faded from the inner part of the display area DPA toward the outermost part of the display area DPA and a non-display area NDA. The display device 10_1 further including the fourth-type pixels PXD may be gradually faded in the corner CA of the display area DPA, and boundaries of pixels PX may be prevented from being visually recognized in the corner CA.

In the embodiments of FIGS. 8 and 9, the first-type pixels PXA in the inner part of the display area DPA and the second-type pixels PXB in the outermost part of the display area DPA may have the emission areas EMA having the same area. However, the disclosure is not limited thereto, and the corner CA of the display area DPA of the display device 10 may also be faded by adjusting the areas of the emission areas EMA of the outermost pixels.

Figure 10:
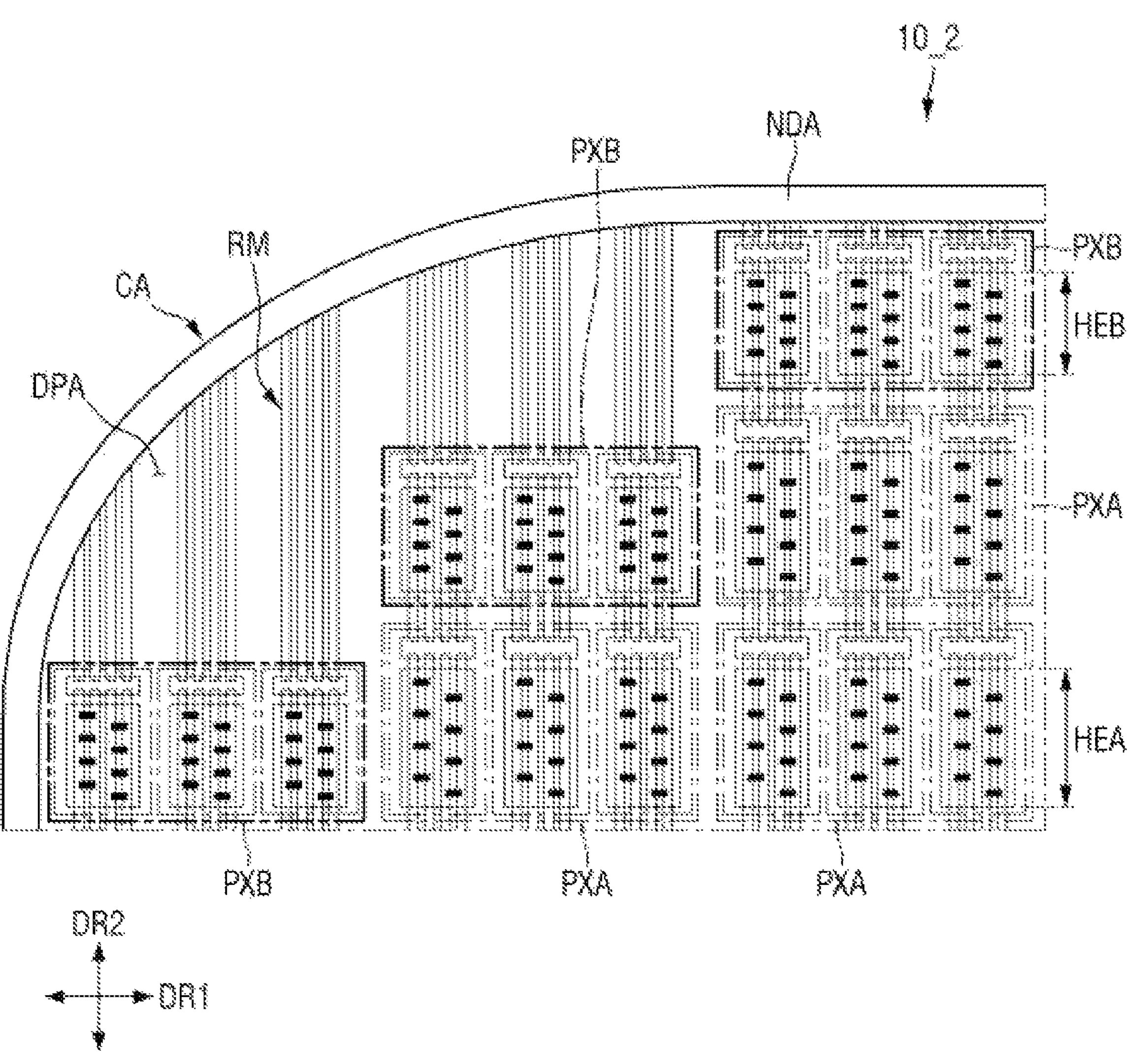
FIGS. 10 to 12 are schematic plan views illustrating the arrangement of different types of pixels disposed in display areas of display devices according to embodiments.
Figure 11:
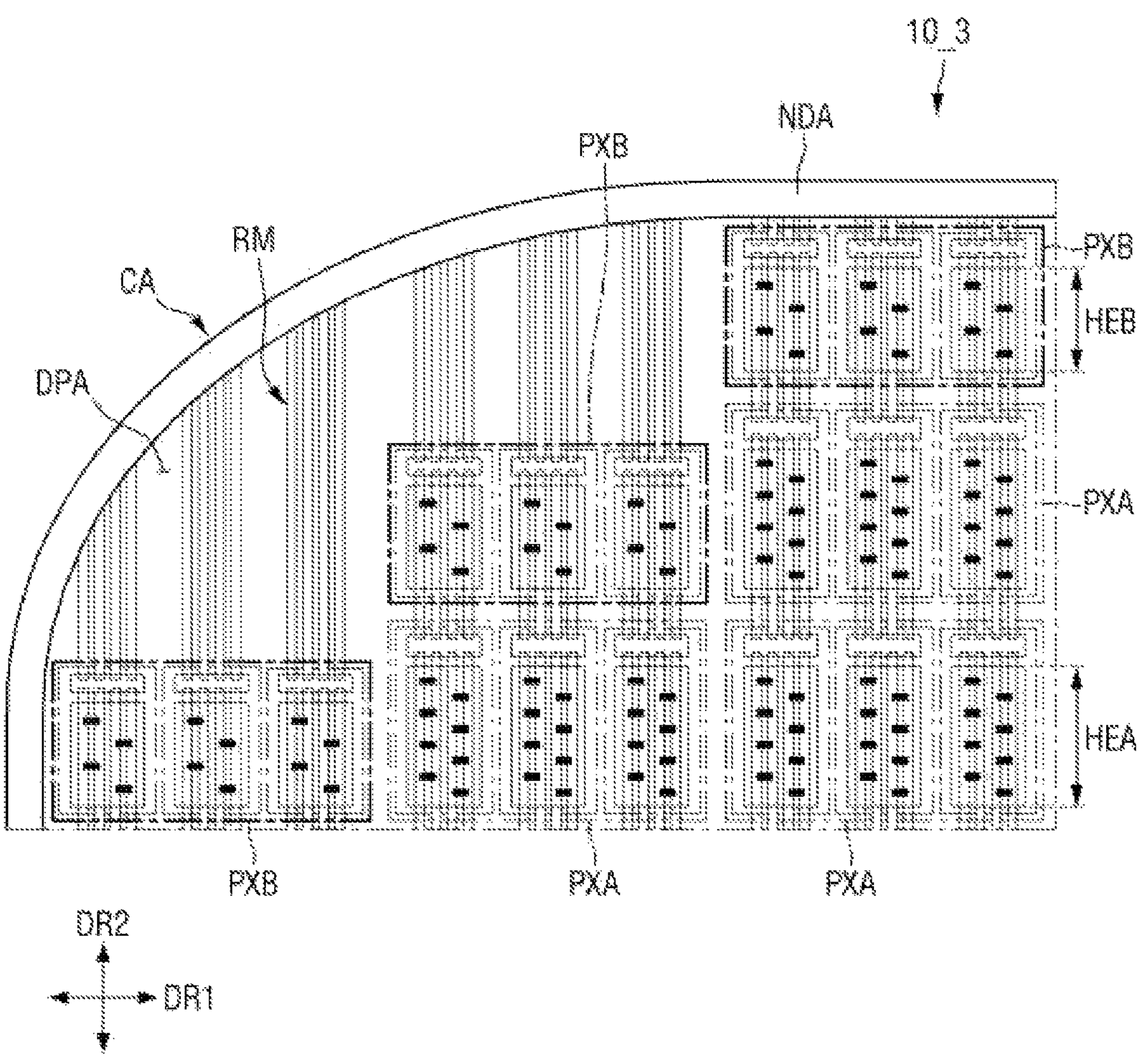
Figure 12:
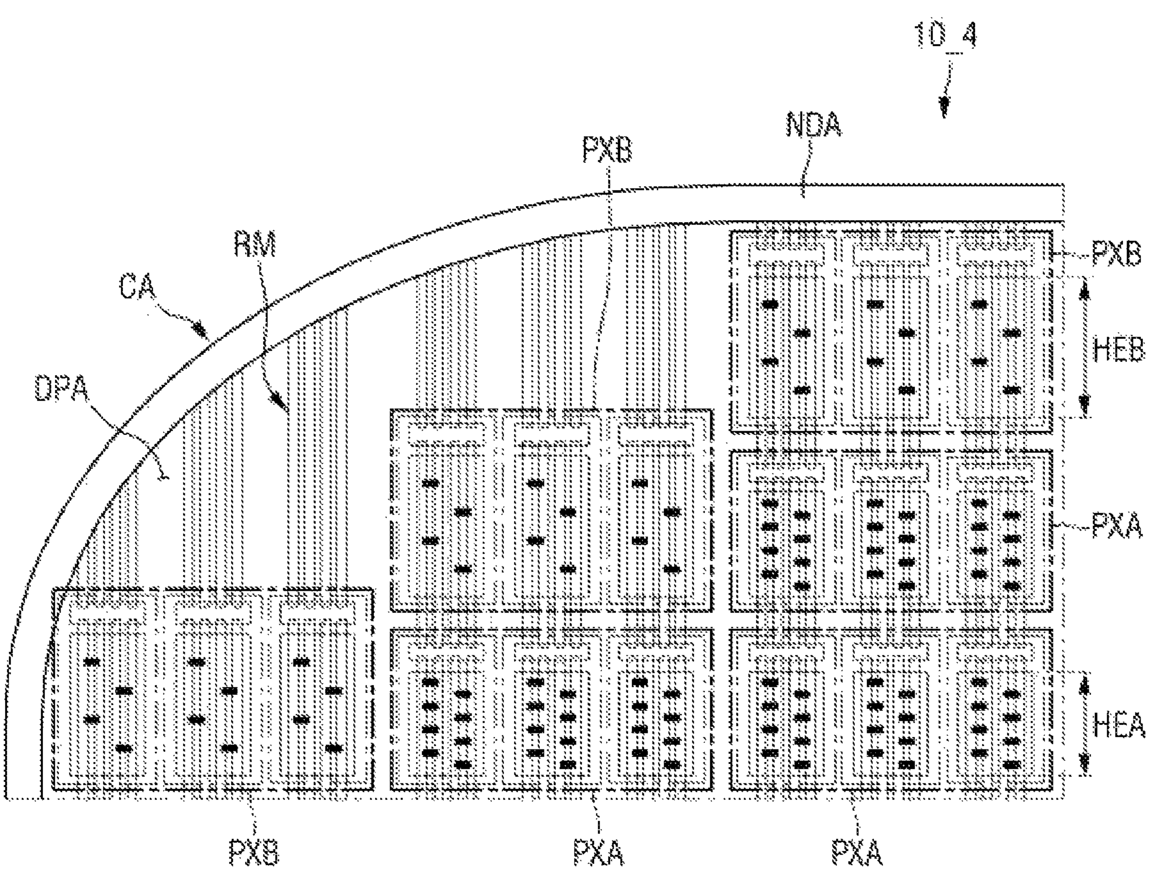
Figure 12:
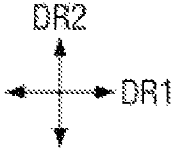

FIGS. 10 to 12 are schematic plan views illustrating the schematic arrangement of different types of pixels disposed in display areas DPA of display devices 10_2 to 10_4 according to embodiments.

First, referring to FIG. 10, in a display device 10_2 according to an embodiment, each subpixel PXn of each second-type pixel PXB may be smaller than each subpixel PXn of each first-type pixel PXA in the area of an emission area EMA. In contrast, the number of light emitting elements ED disposed in each subpixel PXn of each second-type pixel PXB may be equal to the number of light emitting elements ED disposed in each subpixel PXn of each first-type pixel PXA. This embodiment may be different from the embodiment of FIG. 8 at least in that the area of the emission area EMA, not the number of light emitting elements ED, is adjusted to adjust the luminance of each second-type pixel PXB. Therefore, repetitive descriptions thereof will be omitted, and differences will be mainly described below.

As described above, the luminance of each pixel PX may be adjusted through the number of light emitting elements ED or the area of the emission area EMA. For example, in the display device 10_2, a height HEB of each emission area EMA of each second-type pixel PXB measured in the second direction DR2 may be smaller than a height HEA of each emission area EMA of each first-type pixel PXA measured in the second direction DR2. Although the second-type pixels PXB are the same as the first-type pixels PXA in widths of each subpixel PXn and each emission area EMA, the heights HEA and HEB may be different. Therefore, the first-type pixels PXA and the second-type pixels PXB may be different from each other in the area of the emission area EMA.

The subpixels PXn of each second-type pixel PXB may be the same in the number of light emitting elements ED and the area of the emission area EMA, and the second-type pixels PXB may include substantially the same number of light emitting elements ED as the number of light emitting elements ED included in the first-type pixels PXA but may include the emission areas EMA having smaller areas than those of the emission areas EMA of the first-type pixels PXA.

In case that the display device 10_2 is driven, even if a driving signal of the same intensity is transmitted to each pixel PX regardless of the type of the pixel PX, a difference in luminance may not occur between the subpixels PXn of each second-type pixel PXB but may occur between the first-type pixels PXA and the second-type pixels PXB due to a difference in the area of the emission area EMA. The display device 10_2 including the second-type pixels PXB smaller than the first-type pixels PXA in the area of each subpixel PXn or emission area EMA may be gradually faded in a corner CA of the display area DPA, and boundaries of pixels PX may be prevented from being visually recognized in the corner CA.

Referring to FIG. 11, in a display device 10_3 according to an embodiment, each subpixel PXn of each second-type pixel PXB may be smaller than each subpixel PXn of each first-type pixel PXA in the area of an emission area EMA. Further, the number of light emitting elements ED disposed in each subpixel PXn of each second-type pixel PXB may be different from the number of light emitting elements ED disposed in each subpixel PXn of each first-type pixel PXA. For example, each second-type pixel PXB may include a smaller number of light emitting elements ED in each subpixel PXn than that of each first-type pixel PXA.

The subpixels PXn of each second-type pixel PXB may be the same in the number of light emitting elements ED and the area of the emission area EMA. In case that the display device 10_3 is driven, even if a driving signal of the same intensity is transmitted to each pixel PX regardless of the type of the pixel PX, a difference in luminance may not occur between the subpixels PXn of each second-type pixel PXB but may occur between the first-type pixels PXA and the second-type pixels PXB due to a difference in the number of light emitting elements ED and the area of the emission area EMA. The display device 10_3 including the second-type pixels PXB smaller than the first-type pixels PXA in the area of each subpixel PXn or emission area EMA and in the number of light emitting elements ED may be faded in a corner CA of the display area DPA, and boundaries of pixels PX may be prevented from being visually recognized in the corner CA. This embodiment may be different from the embodiments of FIGS. 8 and 10 in that the number of light emitting elements ED and the area of the emission area EMA are adjusted to adjust the luminance of each second-type pixel PXB.

Referring to FIG. 12, in a display device 10_4 according to an embodiment, each subpixel PXn of each second-type pixel PXB may be larger than each subpixel PXn of each first-type pixel PXA in the area of an emission area EMA. In contrast, the number of light emitting elements ED disposed in each subpixel PXn of each second-type pixel PXB may be different from the number of light emitting elements ED disposed in each subpixel PXn of each first-type pixel PXA. For example, each second-type pixel PXB may include a smaller number of light emitting elements ED in each subpixel PXn than that of each first-type pixel PXA.

For example, in the display device 10_4, a height HEB of each emission area EMA of each second-type pixel PXB measured in the second direction DR2 may be greater than a height HEA of each emission area EMA of each first-type pixel PXA measured in the second direction DR2. Although the second-type pixels PXB are the same as the first-type pixels PXA in widths of each subpixel PXn and each emission area EMA, the heights HEA and HEB may be different. Therefore, the first-type pixels PXA and the second-type pixels PXB may be different from each other in the area of the emission area EMA.

The subpixels PXn of each second-type pixel PXB may be the same in the number of light emitting elements ED and the area of the emission area EMA. In case that the display device 10_4 is driven, even if a driving signal of the same intensity is transmitted to each pixel PX regardless of the type of the pixel PX, a difference in luminance may not occur between the subpixels PXn of each second-type pixel PXB but may occur between the first-type pixels PXA and the second-type pixels PXB due to a difference in the number of light emitting elements ED and the area of the emission area EMA. Although each subpixel PXn of each second-type pixel PXB is larger than each subpixel PXn of each first-type pixel PXA in the area of the emission area EMA, the number of light emitting elements ED disposed in each second-type pixel PXB may be smaller than the number of light emitting elements ED disposed in each first-type pixel PXA. Therefore, the luminance of each second-type pixel PXB may be lower than that of each first-type pixel PXA. In the display device 10_4 including the second-type pixels PXB smaller than the first-type pixels PXA in the area of each subpixel PXn or emission area EMA but larger in the number of light emitting elements ED, boundaries of pixels PX may be prevented from being visually recognized in a corner CA. This embodiment may be different from the embodiment of FIG. 11 in that each second-type pixel PXB is larger than each first-type pixel PXA in the area of the emission area EMA.

In the above embodiments, a case where the subpixels PXn of each second-type pixel PXB disposed in the outermost part have the same area has been described. However, the disclosure is not limited thereto, and the subpixels PXn of each second-type pixel PXB disposed in the outermost part may have different areas in order to more effectively prevent the boundaries of the outermost pixels PX in the corner CA from being visually recognized.

FIGS. 13 to 19 are schematic plan views illustrating the schematic arrangement of different types of pixels disposed in display areas DPA of display devices 10_5 to 10_11 according to embodiments.

Figure 13:
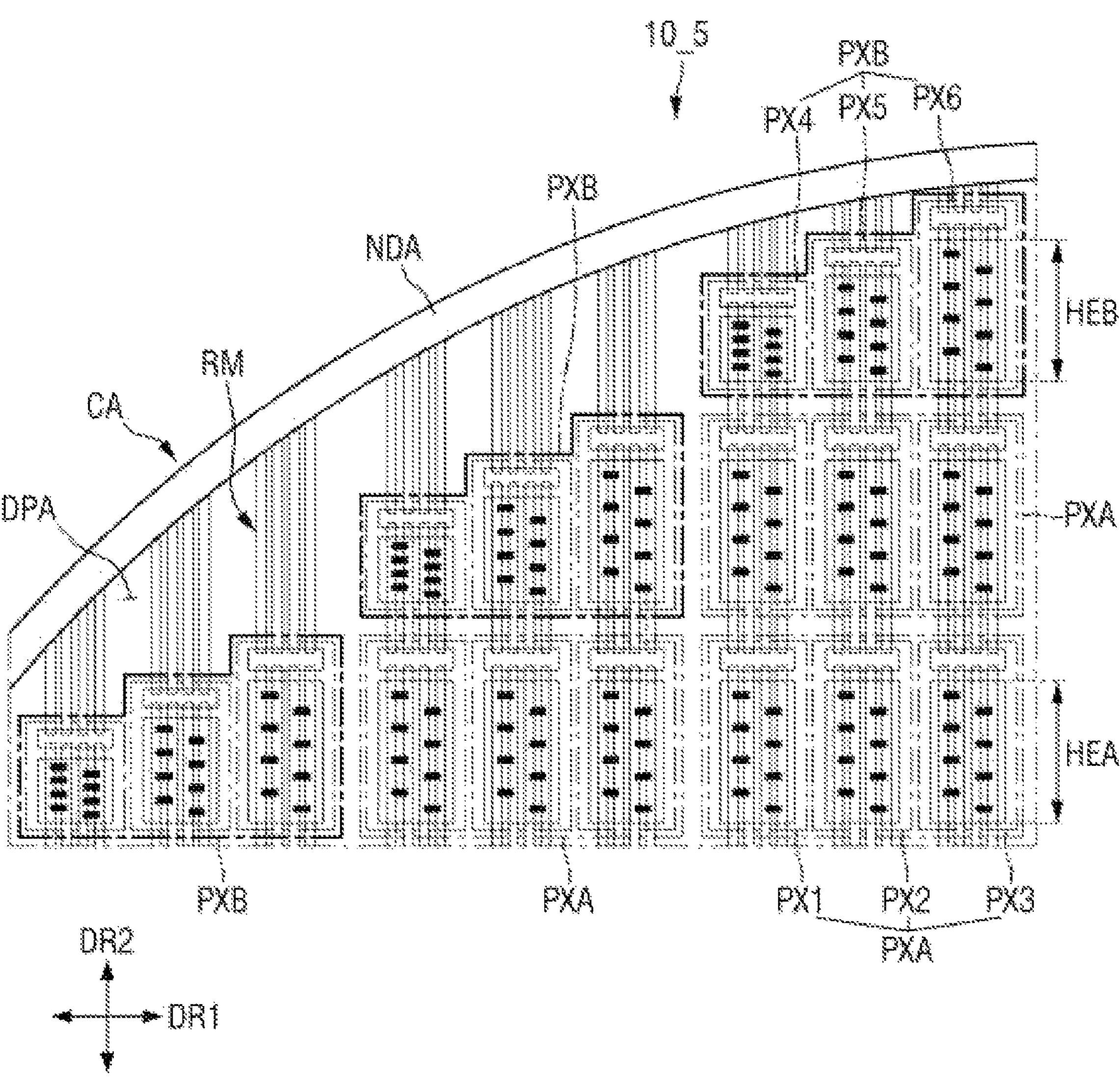
FIGS. 13 to 19 are schematic plan views illustrating the arrangement of different types of pixels disposed in display areas of display devices according to embodiments.

First, referring to FIG. 13, in a display device 10_5 according to an embodiment, each second-type pixel PXB may include subpixels PXn including emission areas EMA having different areas. For example, each second-type pixel PXB may include a fourth subpixel PX4, a fifth subpixel PX5 whose emission area EMA is larger than that of the fourth subpixel PX4, and a sixth subpixel PX6 whose emission area EMA is larger than that of the fifth subpixel PX5. The sixth subpixel PX6 may have substantially the same structure as that of each subpixel PXn of each first-type pixel PXA. For example, the sixth subpixel PX6 may be the same as each subpixel PXn of each first-type pixel PXA in the area of the emission area EMA or the area of the subpixel PXn. The fourth and fifth subpixels PX4 and PX5 may be the same as the subpixels PXn of each first-type pixel PXA except for a difference in the area occupied by the emission area EMA and the subpixel PXn. In contrast, the fourth to sixth subpixels PX4 to PX6 of each second-type pixel PXB may be the same as the subpixels PXn of each first-type pixel PXA in the number of light emitting elements ED. This embodiment may be different from the embodiment of FIG. 8 in that the area of the emission area EMA, not the number of light emitting elements ED, is adjusted to adjust the luminance of each second-type pixel PXB. Therefore, repetitive descriptions thereof will be omitted, and differences will be mainly described below.

In the display device 10_5, each second-type pixel PXB disposed at an outermost part of the display area DPA in a corner CA of the display area DPA may include the subpixels PXn including the emission areas EMA having different areas. The fourth to sixth subpixels PX4 to PX6 may be different in the length of the emission area EMA measured in the second direction DR2 and may be gradually reduced in size in the order of the sixth subpixel PX6, the fifth subpixel PX5, and the fourth subpixel PX4. The fourth subpixel PX4 and the fifth subpixel PX5 may be smaller than the subpixels PXn of each first-type pixel PXA in the area of the emission area EMA. In contrast, the sixth subpixel PX6 may be substantially the same as each subpixel PXn of each first-type pixel PXA in the area of the emission area EMA.

According to an embodiment, in case that the display device 10_5 is driven, a driving signal of a different intensity may be transmitted according to the type of the pixel PX and a subpixel PXn. For example, in an embodiment in which the sixth subpixel PX6 of each second-type pixel PXB has the same structure as that of each subpixel PXn of each first-type pixel PXA, a driving signal of an intensity weaker than that of a driving signal transmitted to each first-type pixel PXA may be transmitted to each second-type pixel PXB. Accordingly, the sixth subpixel PX6 may have a lower luminance than that of each subpixel PXn of each first-type pixel PXA even if they are the same in the area of the emission area EMA and the number of light emitting elements ED.

In case that the fourth to sixth subpixels PX4 to PX6 of each second-type pixel PXB have the emission areas EMA having different areas but include the same number of light emitting elements ED, a difference in luminance may occur between the subpixels PXn of a pixel PX. To prevent the difference, in the display device 10_5 according to the embodiment, driving signals of different intensities may be transmitted to the subpixels PXn of each second-type pixel PXB. In case that the subpixels PXn include the same number of light emitting elements ED but have the emission areas EMA having different areas, the color of light emitted from a subpixel PXn having a large area, for example, the sixth subpixel PX6 may have a higher luminance than that of the color of light emitted from each of the fourth subpixel PX4 and the fifth subpixel PX5.

In an embodiment in which the subpixels PXn emit light of different colors, if the subpixels PXn simultaneously emit light by receiving driving signals of the same intensity, the color of light emitted from the sixth subpixel PX6 may be stronger. Therefore, a desired color may not be displayed. To prevent this, in an embodiment in which the subpixels PXn include the emission areas EMA having different areas, the subpixels PXn may emit light by receiving driving signals of different intensities. Accordingly, even if the subpixels PXn include the emission areas EMA having different areas but include the same number of light emitting elements ED, there may be little difference in luminance between the subpixels PXn.

Figure 14:
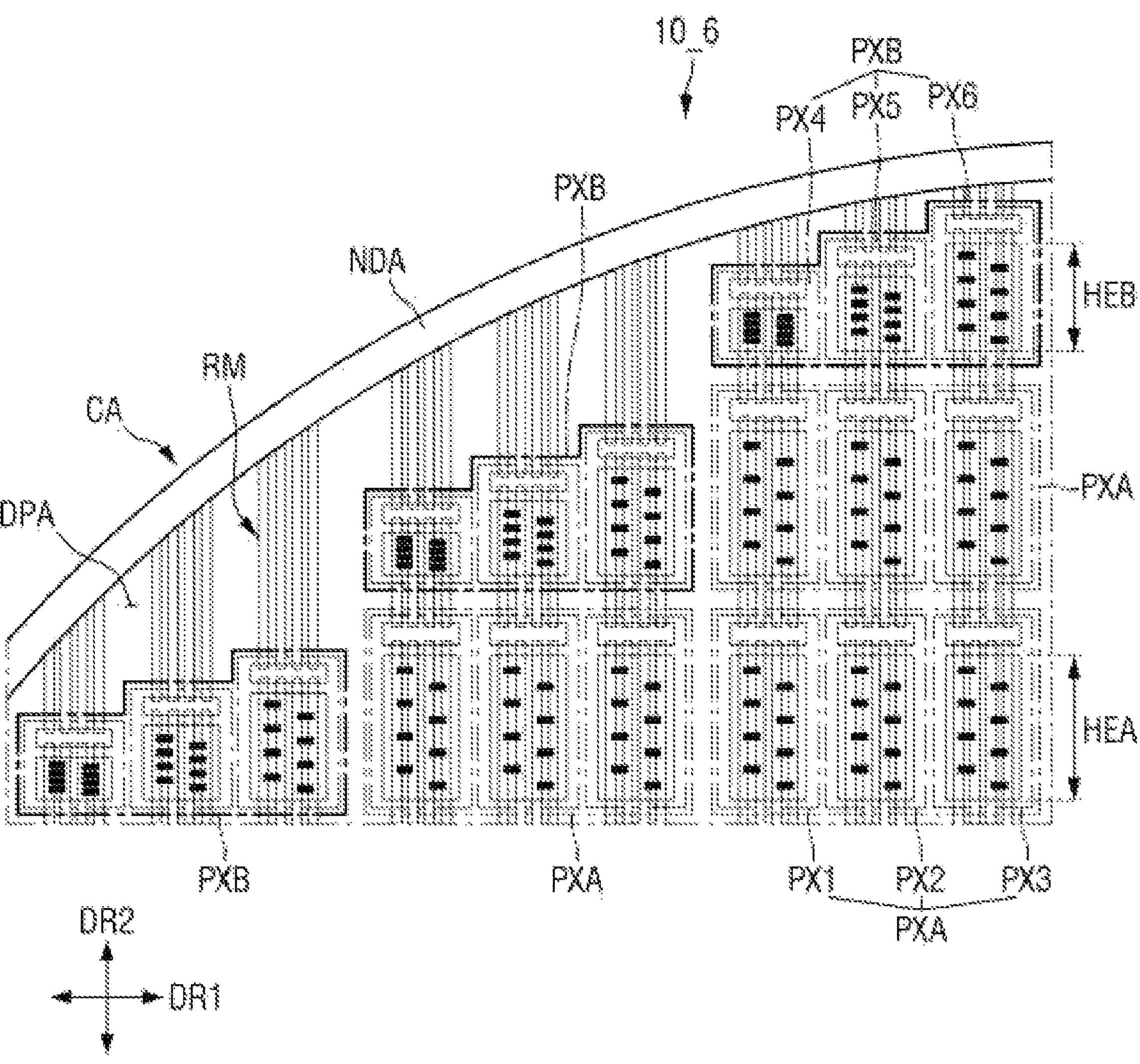

Referring to FIG. 14, in a display device 10_6 according to an embodiment, each second-type pixel PXB may include subpixels PXn including emission areas EMA having different areas, and a sixth subpixel PX6 having the largest area may have an emission area EMA having a smaller area than an emission area EMA of each subpixel PXn of each first-type pixel PXA. A height HEB of the emission area EMA of the sixth subpixel PX6 may be smaller than a height HEA of the emission area EMA of each subpixel PXn of each first-type pixel PXA. This embodiment may be different from the embodiment of FIG. 13 at least in that the sixth subpixel PX6 also has a smaller area than that of each subpixel PXn of each first-type pixel PXA. Therefore, repetitive descriptions thereof will be omitted.

Figure 15:
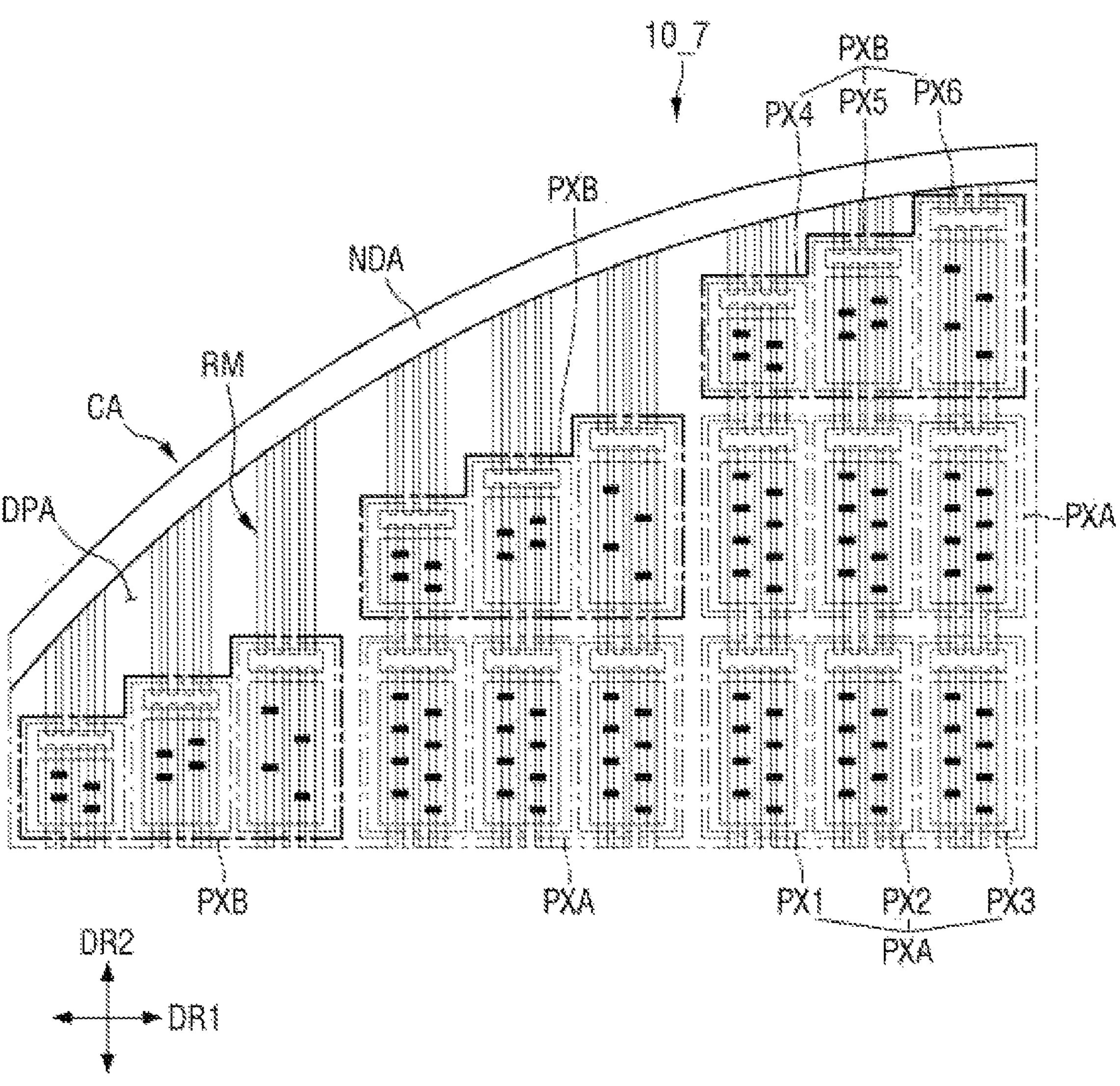

Referring to FIG. 15, in a display device 10_7 according to an embodiment, each second-type pixel PXB may include fourth to sixth subpixels PX4 to PX6 having emission areas EMA having different areas, and the number of light emitting elements ED disposed in each subpixel PXn of each second-type pixel PXB may be different from the number of light emitting elements ED disposed in each subpixel PXn of each first-type pixel PXA. For example, the number of light emitting elements ED disposed in each subpixel PXn of each second-type pixel PXB may be smaller than the number of light emitting elements ED disposed in each subpixel PXn of each first-type pixel PXA.

In the display device 10_7, each second-type pixel PXB may include the subpixels PXn having the emission areas EMA having smaller areas than emission areas EMA of the subpixels PXn of each first-type pixel PXA, and the areas of the emission areas EMA between the subpixels PXn of each second-type pixel PXB may be different. Each subpixel PXn of each second-type pixel PXB may include a smaller number of light emitting elements ED than that of each subpixel PXn of each first-type pixel PXA. Therefore, the second-type pixels PXB may have a lower luminance than that of the first-type pixels PXA and thus may be faded in a corner CA of the display area DPA.

Even if driving signals of the same intensity are transmitted to the first-type pixels PXA and the second-type pixels PXB, the first-type pixels PXA and the second-type pixels PXB may have different luminances because of a difference in the number of light emitting elements ED. Here, driving signals of different intensities should be transmitted to the subpixels PXn of each second-type pixel PXB to compensate for a difference in luminance due to the difference in the area of the emission area EMA between the subpixels PXn. This embodiment may be different from the embodiment of FIG. 14 at least in that each subpixel PXn of each second-type pixel PXB includes a smaller number of light emitting elements ED than that of each subpixel PXn of each first-type pixel PXA. Therefore, repetitive descriptions thereof will be omitted.

Figure 16:
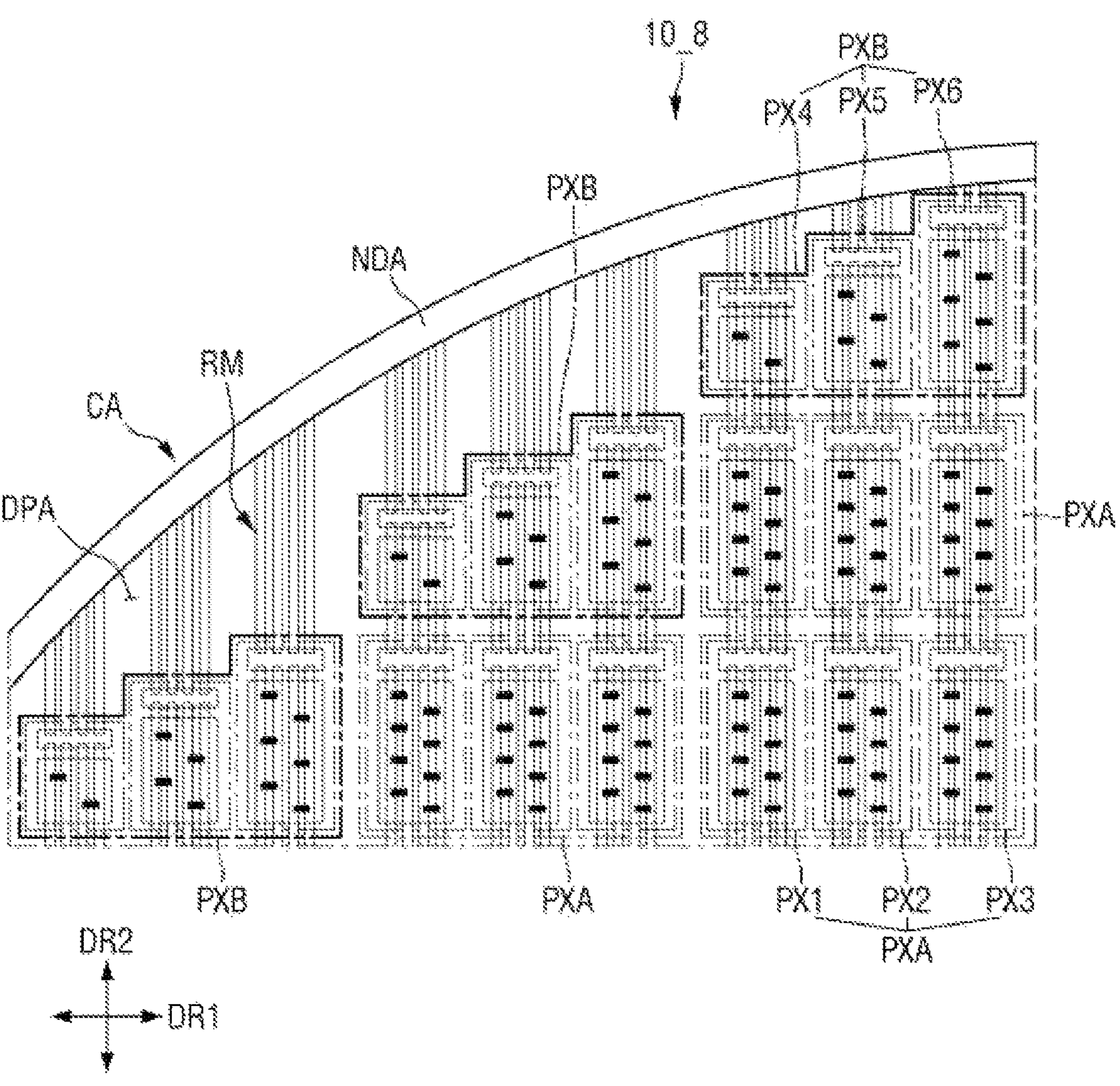
Figure 17:
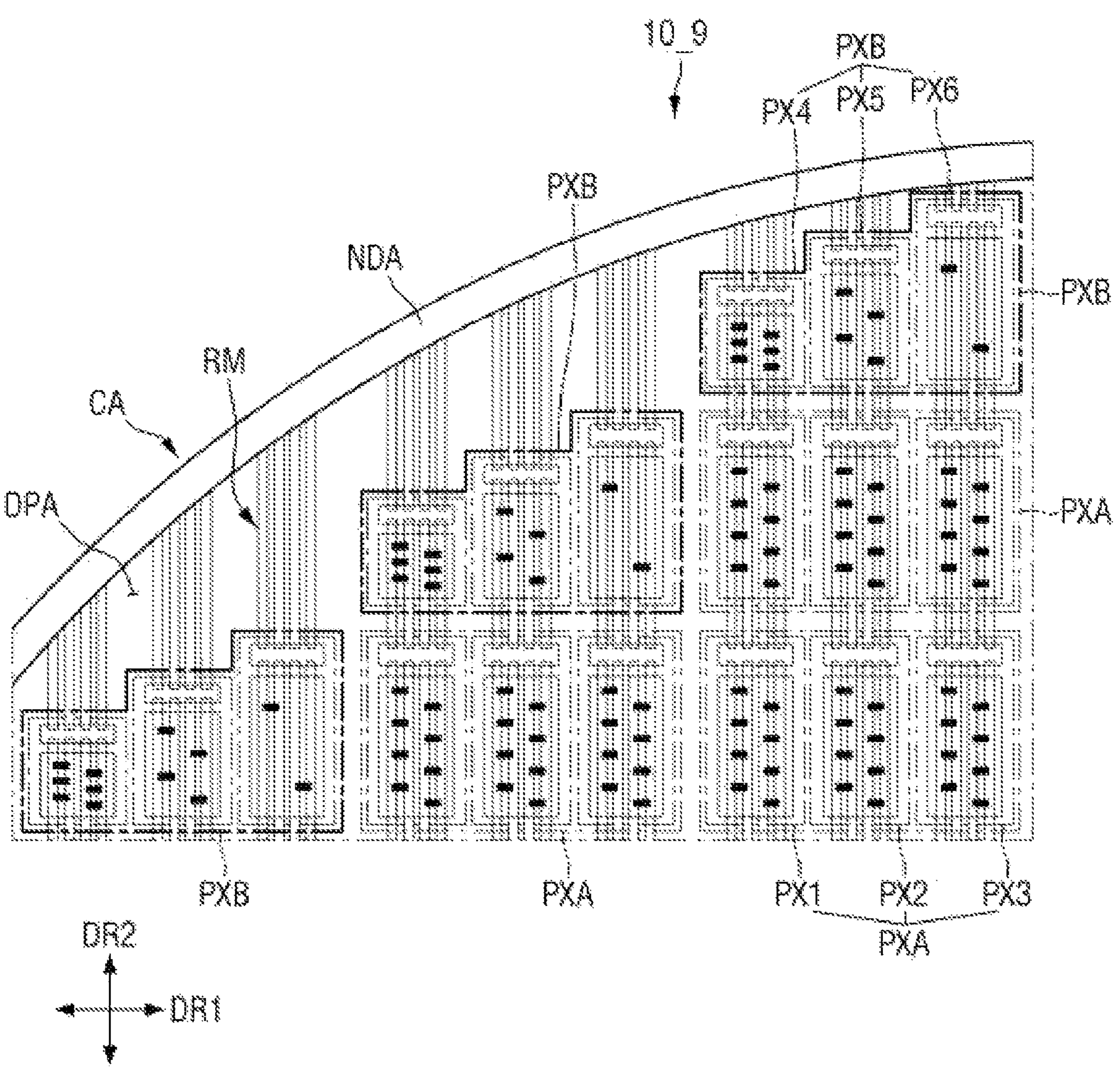

Referring to FIGS. 16 and 17, each second-type pixel PXB having emission areas EMA having different areas in the display devices 10_8 and 10_9 according to embodiments may include a different number of light emitting elements ED in each subpixel PXn. In the display device 10_8 of FIG. 16, the number of light emitting elements ED may increase sequentially in the order of a fourth subpixel PX4, a fifth subpixel PX5, and a sixth subpixel PX6. In contrast, in the display device 10_9 of FIG. 17, the number of light emitting elements ED may decrease sequentially in the order of a fourth subpixel PX4, a fifth subpixel PX5, and a sixth subpixel PX6.

In the display device 10_8 of FIG. 16, each subpixel PXn of each second-type pixel PXB of the display device 10_8 of FIG. 16 may include a number of light emitting elements ED proportional to the area of the emission area EMA. Since each subpixel PXn of each second-type pixel PXB may include a smaller number of light emitting elements ED than that of each subpixel PXn of each first-type pixel PXA, the second-type pixels PXB may have a lower luminance than that of the first-type pixels PXA. Here, since the number of light emitting elements ED in each subpixel PXn, similar to the area of the emission area EMA, increases sequentially in the order of the fourth subpixel PX4, the fifth subpixel PX5 and the sixth subpixel PX6, there may be a difference in luminance between the subpixels PXn. Therefore, in case that the second-type pixels PXB are driven, it may be necessary to compensate for the difference in luminance between the subpixels PXn by correcting the intensity of a driving signal transmitted to each subpixel PXn.

In contrast, in the display device 10_9 of FIG. 17, each subpixel PXn of each second-type pixel PXB may include a number of light emitting elements ED inversely proportional to the area of the emission area EMA. Since each subpixel PXn of each second-type pixel PXB may include a smaller number of light emitting elements ED than that of each subpixel PXn of each first-type pixel PXA, the second-type pixels PXB may have a lower luminance than that of the first-type pixels PXA. Since the number of light emitting elements ED in each subpixel PXn, unlike the area of the emission area EMA, decreases sequentially in the order of the fourth subpixel PX4, the fifth subpixel PX5, and the sixth subpixel PX6, a difference in luminance between the subpixels PXn may be corrected by the number of light emitting elements ED even without correction of the intensity of a driving signal. In this embodiment, although the subpixels PXn of each second-type pixel PXB have the emission areas EMA having different areas, the fourth to sixth subpixels PX4 to PX6 may have a uniform luminance without correction of a driving signal by adjusting the number of light emitting elements ED to be inversely proportional to the area of the emission area EMA.

Figure 18:
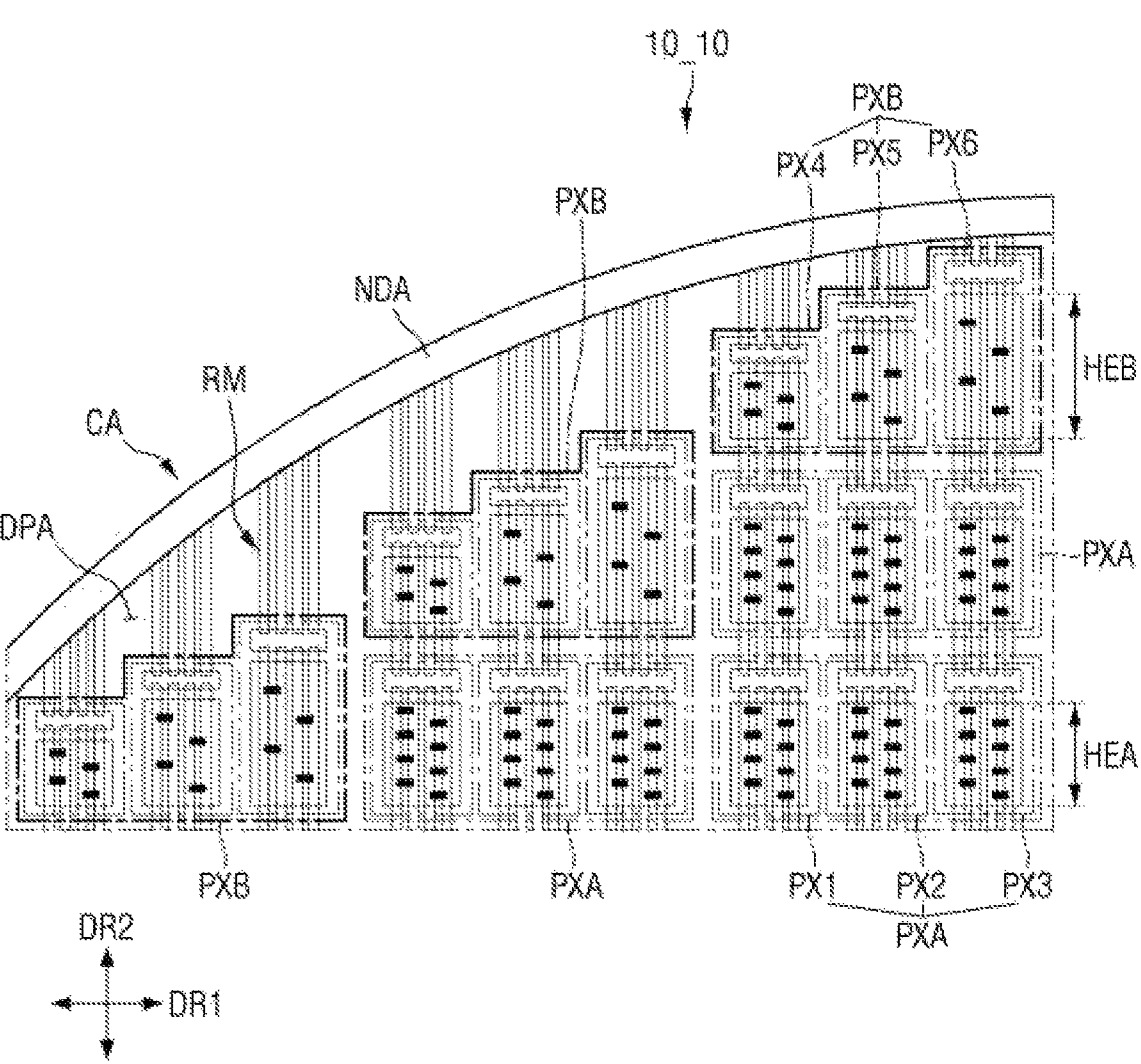
Figure 19:
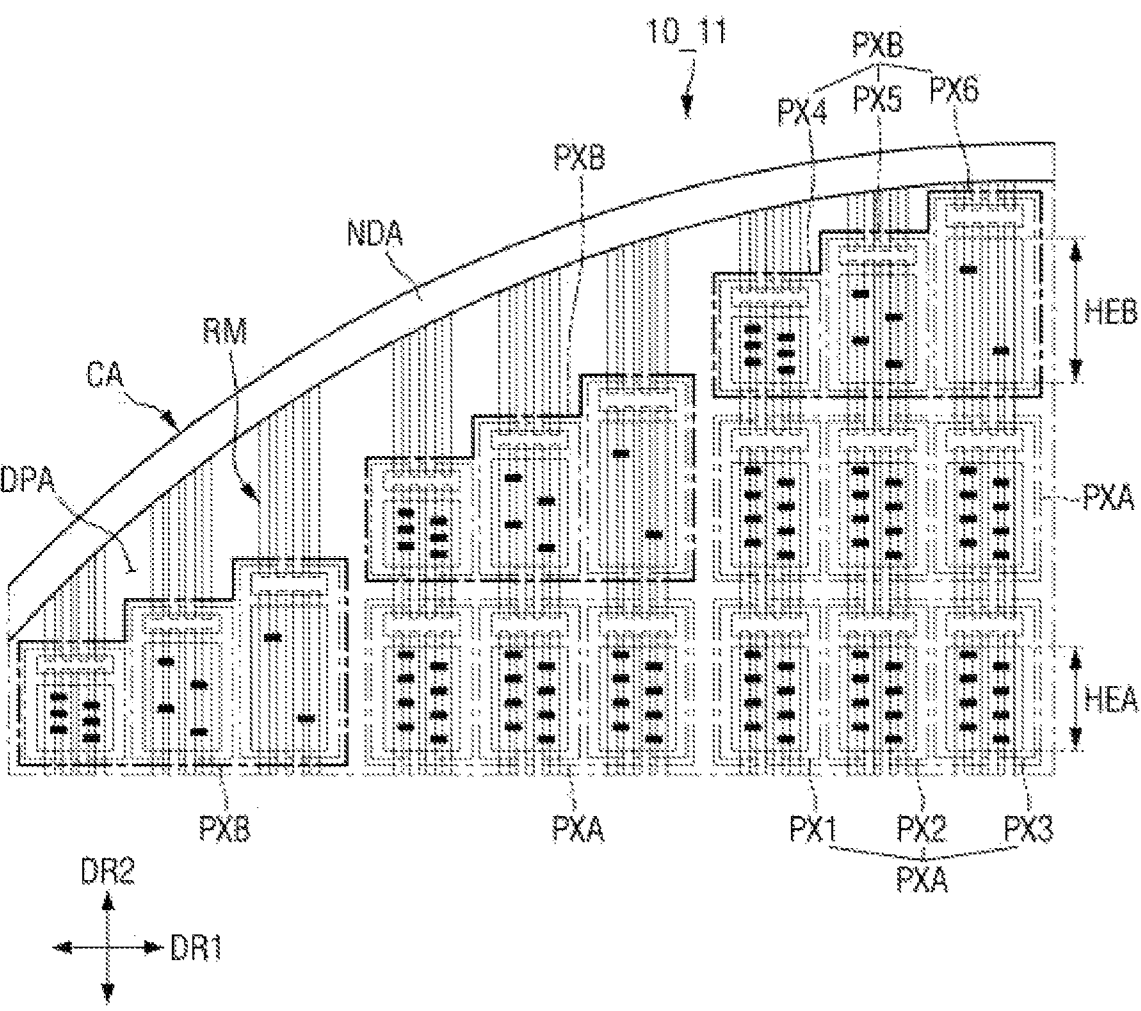

Referring to FIGS. 18 and 19, in display devices 10_10 and 10_11 according to embodiments, each second-type pixel PXB may have emission areas EMA having different areas, and a sixth subpixel PX6 may have an emission area EMA having a larger area than that of an emission area EMA of each subpixel PXn of each first-type pixel PXA.

The display device 10_10 of FIG. 18 may be different from the embodiment of FIG. 15 at least in that a height HEB of the emission area EMA of the sixth subpixel PX6 is greater than a height HEA of the emission area EMA of each subpixel PXn of each first-type pixel PXA. The embodiment of FIG. 18 may have a structure according to a combination of the embodiments of FIGS. 12 and 15. The display device 10_11 of FIG. 19 may be different from the embodiment of FIG. 17 at least in that a height HEB of the emission area EMA of the sixth subpixel PX6 is greater than a height HEA of the emission area EMA of each subpixel PXn of each first-type pixel PXA. The embodiment of FIG. 19 may have a structure according to a combination of FIGS. 12 and 17. Therefore, repetitive descriptions thereof will be omitted.

Although the area occupied by each subpixel PXn of each second-type pixel PXB is smaller than the area occupied by each subpixel PXn of each first-type pixel PXA, but the disclosure is not limited thereto. In some embodiments, the area of each subpixel PXn of each second-type pixel PXB may be the same as the area of each subpixel PXn of each first-type pixel PXA, and only the area of the emission area EMA may be smaller in each subpixel PXn of each second-type pixel PXB than in each subpixel PXn of each first-type pixel PXA.

Figure 20:
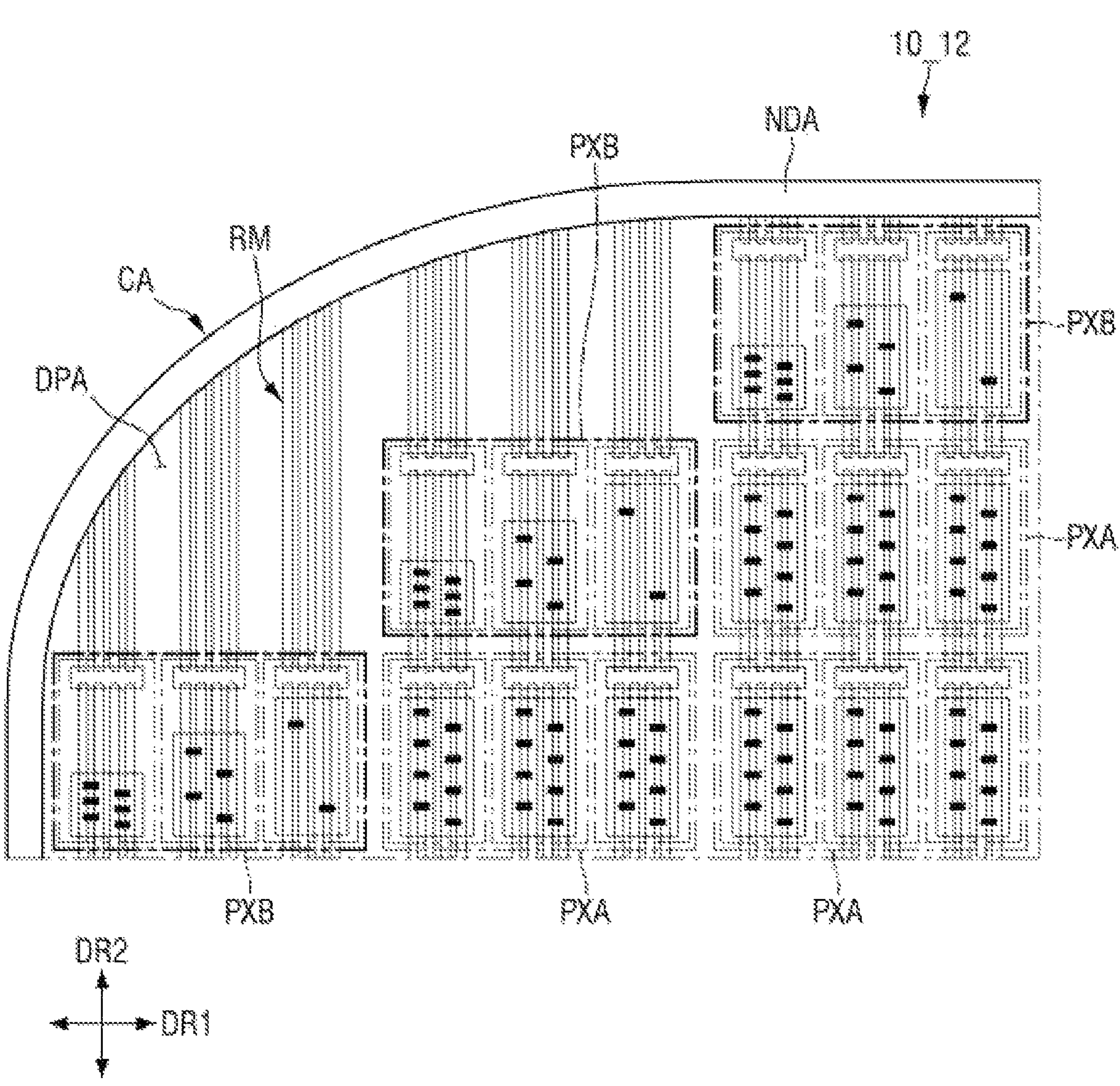
FIG. 20 is a schematic plan view illustrating the arrangement of different types of pixels disposed in a display area of a display device according to an embodiment.

Referring to FIG. 20, in a display device 10_12 according to an embodiment, each subpixel PXn of each second-type pixel PXB may be smaller than each subpixel PXn of each first-type pixel PXA in the area of an emission area EMA, but the area occupied by each subpixel PXn of each second-type pixel PXB may be the same as the area occupied by each subpixel PXn of each first-type pixel PXA. Accordingly, in the first- and second-type pixels PXA and PXB neighboring each other in the first direction DR1, subareas SA of the subpixels PXn may be disposed side by side in the first direction DR1, and thus a process of cutting electrode lines RM may be readily performed.

In the above embodiments, the subpixels PXn of the second-type pixels PXB disposed in the outermost part may have a rectangular shape in a plan view. However, the disclosure is not limited thereto. In order to more effectively prevent the boundaries of the outermost pixels PX in the corner CA from being visually recognized, the shape of each of the subpixels PXn of the second-type pixels PXB disposed in the outermost part may include an area partially curved along the curved outer side CS of the corner CA.

Figure 21:
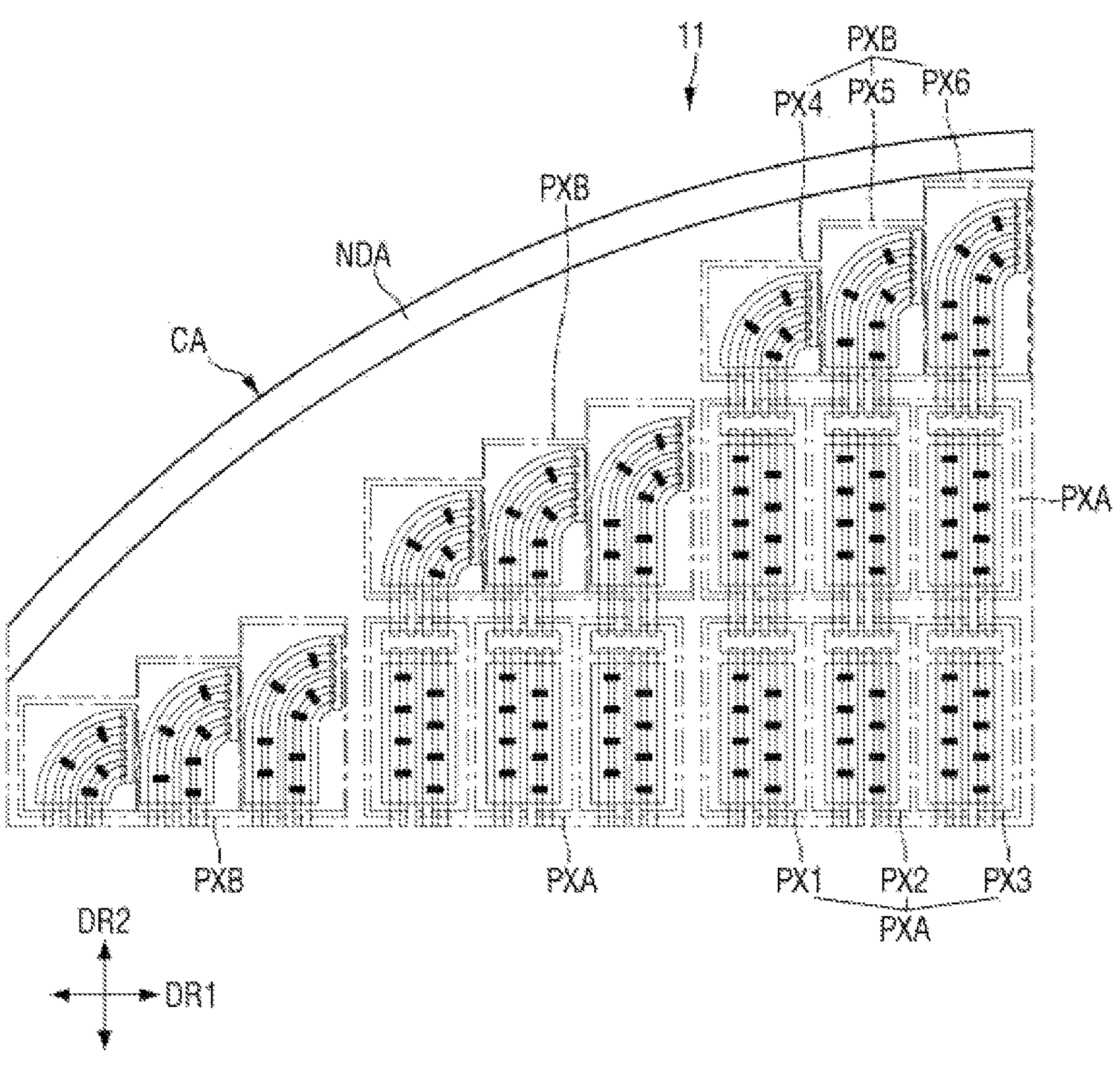
FIG. 21 is a schematic plan view illustrating the arrangement of different types of pixels disposed in a display area of a display device according to an embodiment.
Figure 22:
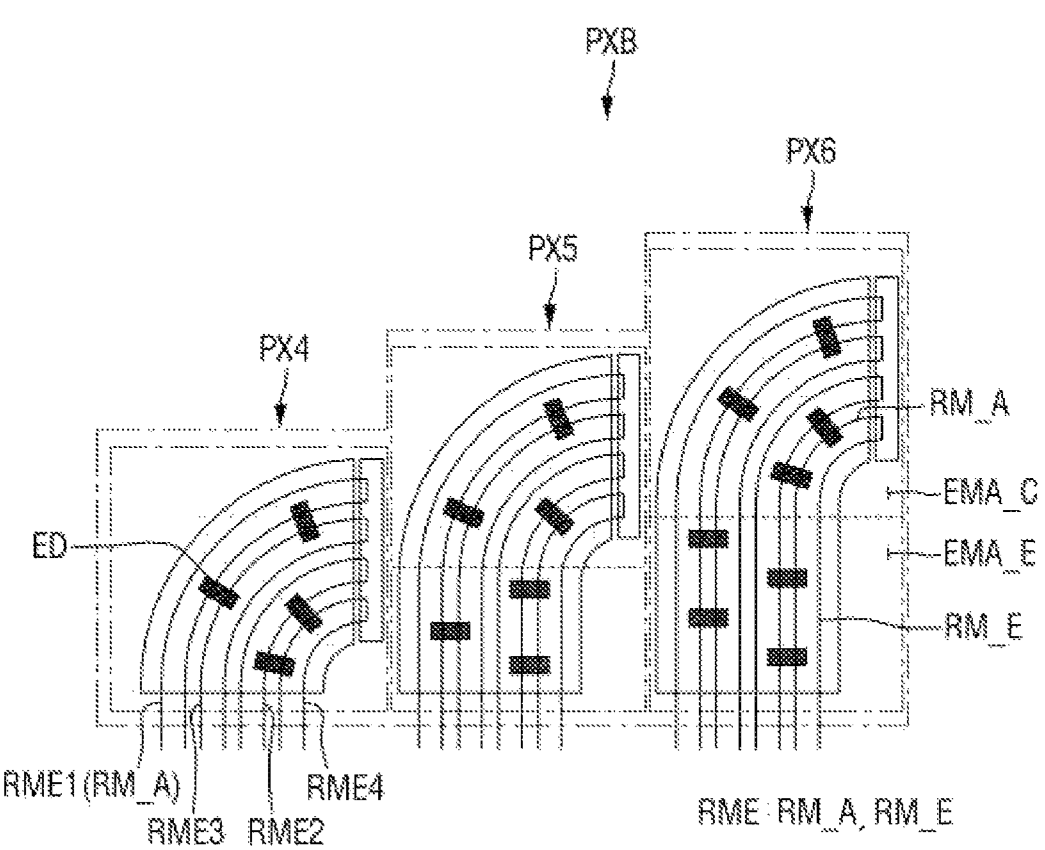
FIG. 22 is a schematic view of a second-type pixel included in the display device of FIG. 21.

FIG. 21 is a schematic plan view illustrating the schematic arrangement of different types of pixels disposed in a display area DPA of a display device 11 according to an embodiment. FIG. 22 is a schematic view of a second-type pixel PXB included in the display device 11 of FIG. 21. FIG. 22 schematically illustrates only the structure of electrodes RME of the second-type pixel PXB.

Referring to FIGS. 21 and 22, in the display device 11 according to the embodiment, second-type pixels PXB may include the electrodes RME having a curved part. The electrodes RME disposed in the second-type pixels PXB may each include an electrode bent part RM_A extending at least in the second direction DR2 and curved in the first direction DR1. In some subpixels PXn of each second type pixel PXB, the electrodes RME may each include an electrode extending part RM_E extending in the second direction DR2 and electrically connected to the electrode bent part RM_A. In fourth to sixth subpixels PX4 to PX6 of each second-type pixel PXB, the electrodes RME disposed in an emission area EMA may each include the electrode bent part RM_A. Therefore, the fourth to sixth subpixels PX4 to PX6 may include emission areas EMA having different areas as in the embodiment of FIG. 13. This embodiment may be different from the embodiment of FIG. 13 in the shapes of the electrodes RME disposed in the second-type pixels PXB. Therefore, repetitive descriptions will be omitted, and differences will be mainly described below.

The fourth subpixel PX4 of each second-type pixel PXB may include the electrode bent parts RM_A extending from a first-type pixel PXA, which neighbors in the second direction DR2, and curved in the emission area EMA in the first direction DR1. First to fourth electrodes RME1 to RME4 of the fourth subpixel PX4 may respectively include the electrode bent parts RM_A and may be disposed in an arc shape. The fourth subpixel PX4 may include the fourth electrode RME4 disposed on a lower right side of a center of the fourth subpixel PX4, the second electrode RME2 spaced apart from the fourth electrode RME4 to surround the fourth electrode RME4, the third electrode RME3 spaced apart from the second electrode RME2 to surround the second electrode RME2, and the first electrode RME1 spaced apart from the third electrode RME3 to surround the third electrode RME3.

Unlike the fourth subpixel PX4, the fifth subpixel PX5 and the sixth subpixel PX6 may include the electrode extending parts RM_E electrically connected to the electrode bent parts RM_A. The electrode extending parts RM_E may extend from a first-type pixel PXA neighboring in the second direction DR2. The arrangement of the electrode extending parts RM_E may be the same as described above with reference to other drawings. The electrode bent parts RM_A of the fifth subpixel PX5 and the sixth subpixel PX6 may be disposed in a similar manner to the electrode bent parts RM_A of the fourth subpixel PX4. The emission area EMA of each of the fifth subpixel PX5 and the sixth subpixel PX6 may include a first part EMA_E in which the electrode extending parts RM_E are disposed and a second part EMA_C in which the electrode bent parts RM_A are disposed.

In the display device 11 according to the current embodiment, the electrodes RME of the second-type pixels PXB may include the electrode bent parts RM_A curved along the shape of an outer side CS of a corner CA. In the display device 11, even if there is insufficient space to place pixels PX in the display area DPA in the corner CA, the pixels PX may be disposed in the display area DPA in the corner CA, thereby reducing or minimizing a space in which the pixels PX are not disposed in the display area DPA.

Figure 23:
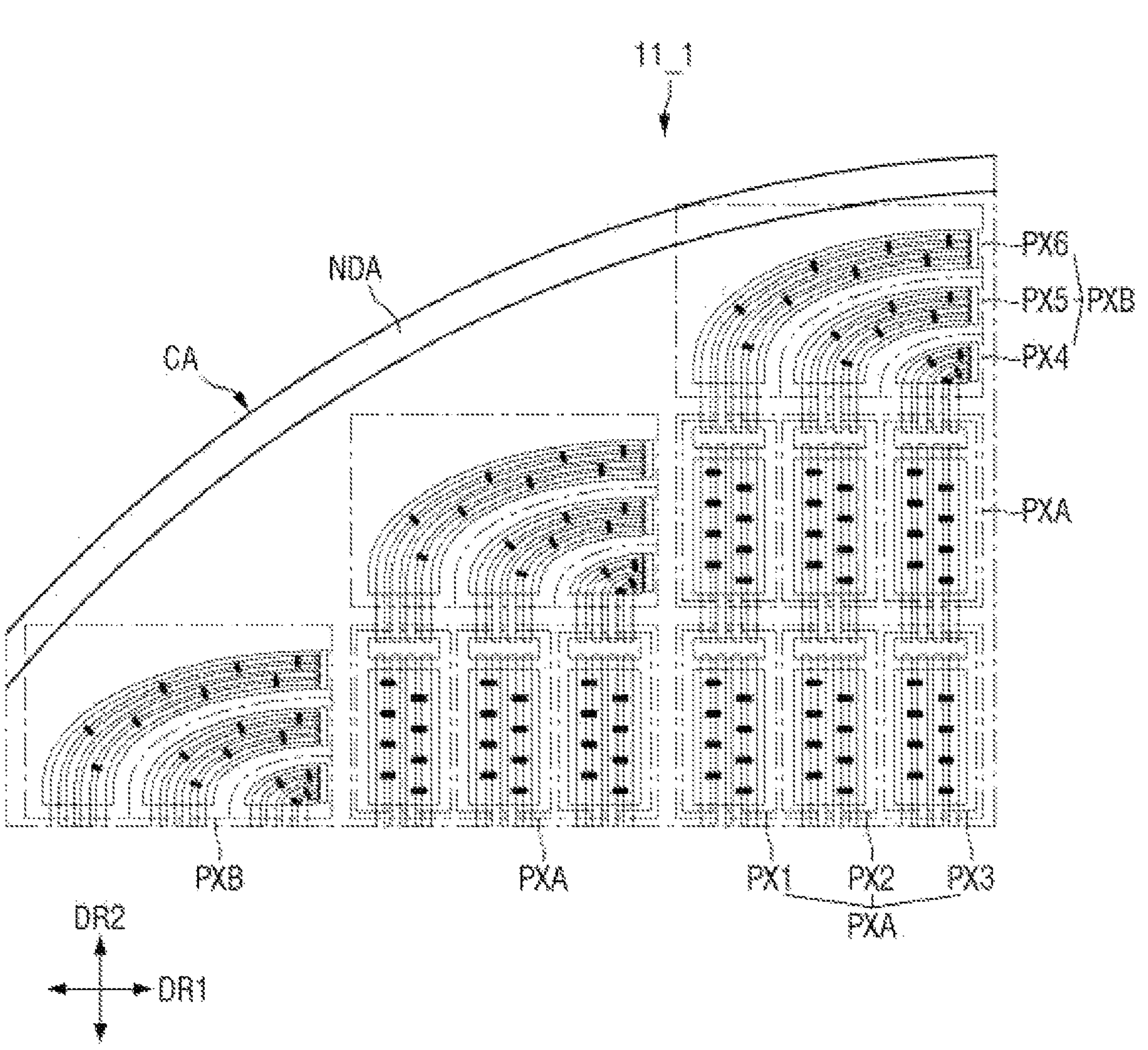
FIG. 23 is a schematic plan view illustrating the arrangement of different types of pixels disposed in a display area of a display device according to an embodiment.
Figure 24:
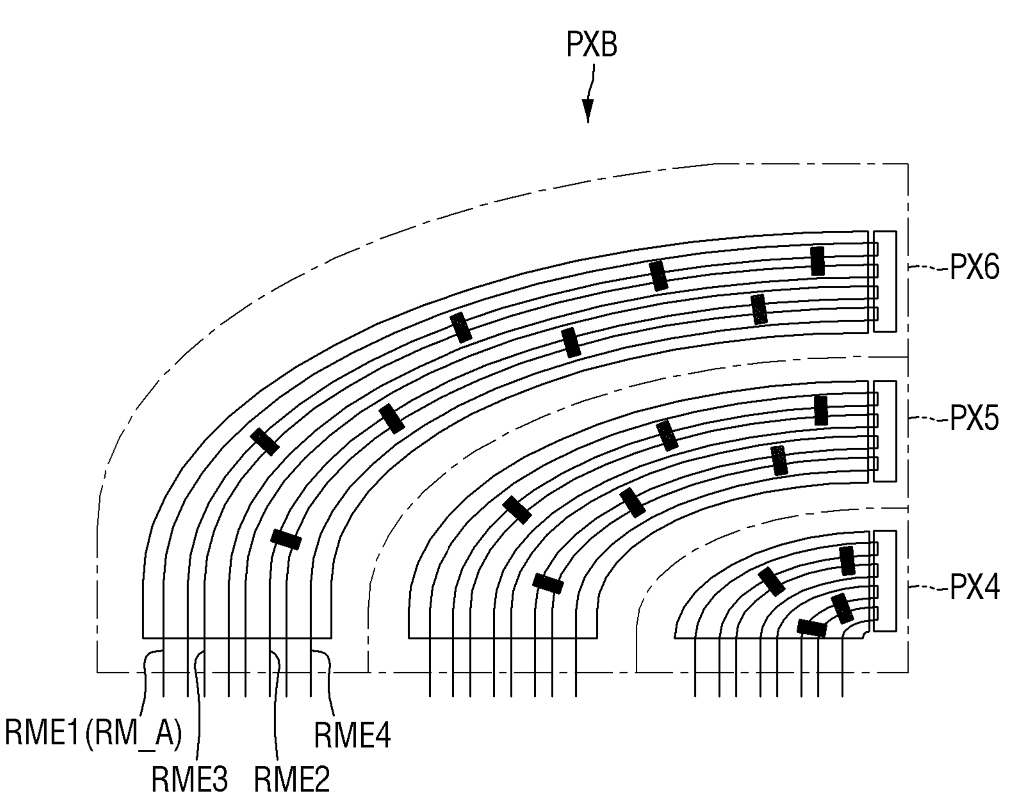
FIG. 24 is a schematic view of a second-type pixel included in the display device of FIG. 23.

FIG. 23 is a schematic plan view illustrating the schematic arrangement of different types of pixels disposed in a display area DPA of a display device 11_1 according to an embodiment. FIG. 24 is a schematic view of a second-type pixel PXB included in the display device 11_1 of FIG. 23.

Referring to FIGS. 23 and 24, the display device 11_1 according to the embodiment may be different from the embodiment of FIGS. 21 and 22 at least in that electrodes RME of second-type pixels PXB are formed as electrode bent parts RM_A. In the display device 11_1, since the electrodes RME of the second-type pixels PXB have an arc shape, a subpixel PXn may partially surround another subpixel PXn. For example, a fourth subpixel PX4 may be disposed on a lower right side of a center of each second-type pixel PXB, a fifth subpixel PX5 may partially surround the fourth subpixel PX4, and a sixth subpixel PX6 may partially surround the fifth subpixel PX5. In each second-type pixel PXB, areas of the fourth subpixel PX4, the fifth subpixel PX5, and the sixth subpixel PX6 may increase sequentially. Since the electrodes RME of the second-type pixels PXB include only the electrode bent parts RM_A, the second-type pixels PXB may generally have a shape corresponding to a curved outer side CS of a corner CA. In the display device 11_1, even if there is insufficient space to place pixels PX in the display area DPA in the corner CA, the pixels PX may be disposed in the display area DPA in the corner CA, thereby reducing or minimizing a space in which the pixels PX are not disposed in the display area DPA.

Figure 25:
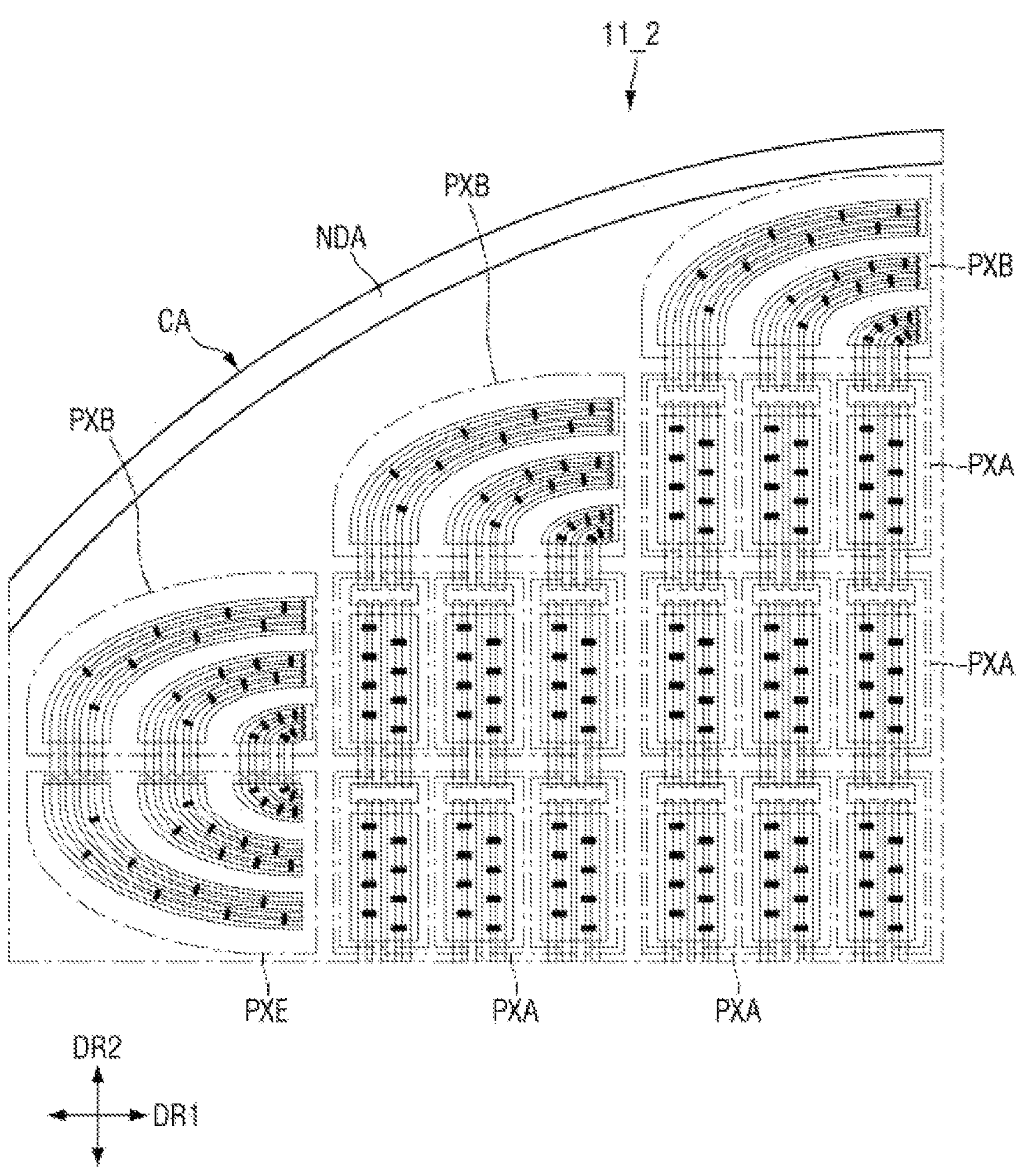
FIG. 25 is a schematic plan view illustrating the arrangement of different types of pixels disposed in a display area of a display device according to an embodiment.

FIG. 25 is a schematic plan view illustrating the schematic arrangement of different types of pixels disposed in a display area DPA of a display device 11_2 according to an embodiment.

Referring to FIG. 25, the display device 11_2 according to the embodiment may further include a fifth-type pixel PXE, which is an outermost pixel disposed in the display area DPA in a corner CA and symmetrical to each second-type pixel PXB in the structure of electrodes RME. This embodiment may be different from the embodiment of FIG. 23 in the arrangement of pixels PX in an outermost part of the display area DPA.

Similar to the second-type pixels PXB, in the fifth-type pixel PXE, each electrode RME may include an electrode bent part RM_A. The second-type pixels PXB disposed in the outermost part may be disposed on a side of first-type pixels PXA in the first direction DR1, and the fifth-type pixel PXE may be disposed on a side of a second-type pixel PXB in the second direction DR2. In case that an outermost pixel PX is disposed on a side of a second-type pixel PXB in the second direction DR2, the fifth-type pixel PXE may be disposed instead of a third-type pixel PXC which is the same as each first-type pixel PXA in the number of light emitting elements ED and the area of an emission area EMA. The electrodes RME of the second- and fifth-type pixels PXB and PXE may respectively include the electrode bent parts RM_A, but their structures are symmetrical to each other. Therefore, the electrode bent parts RM_A of the second- and fifth-type pixels PXB and PXE may be disposed according to their curvatures to cover sides of first-type pixels PXA disposed in different pixel rows PX_C. The electrode bent parts RM_A may be separated from each other at a boundary between the different pixel rows PX_C to form the second- and fifth-type pixels PXB and PXE, respectively.

A display device according to an embodiment may include different types of pixels disposed in a display area in each corner, for example, pixels having different numbers of light emitting elements per unit area. In the display device, pixels having different numbers of light emitting elements per unit area are disposed in an outermost part of the display area, thereby preventing boundaries of the pixels from being visually recognized in the display area in each corner.

In concluding the detailed description, those skilled in the art will appreciate that many variations and modifications may be made to the preferred embodiments without substantially departing from the principles of the disclosure. Therefore, the disclosed embodiments of the disclosure are used in a generic and descriptive sense only and not for purposes of limitation.

What is claimed is:

1. A display device comprising:

a display area in which a plurality of pixels comprising a plurality of subpixels are arranged, the plurality of subpixels each including an emission area corresponding to a respective opening in a bank;

a non-display area which surrounds the display area;

a plurality of electrodes, each of which includes at least a part extending in a direction in the display area and is spaced apart from each other in each of the plurality of subpixels;

a plurality of light emitting elements which are disposed on the plurality of electrodes in the emission area; and a plurality of contact electrodes, each contacting the plurality of light emitting elements and one of the plurality of electrodes, wherein each subpixel of the plurality of subpixels includes multiple light emitting elements of the plurality of light emitting elements;

the plurality of pixels comprise:

a first-type pixel which is disposed in the display area; and a second-type pixel which is disposed in an outermost part of the display area, and a number of light emitting elements per unit area in the emission area of a subpixel of the first-type pixel is different from a number of light emitting elements per unit area in the emission area of a subpixel of the second-type pixel.

2. The display device of claim 1, wherein a number of the second-type pixels is at least two in number, and the plurality of pixels comprises a third-type pixel which is disposed inside and adjacent to at least two of the second-type pixels in the display area.

3. The display device of claim 2, further comprising a third-type pixel which is disposed in the outermost part of the display area to correspond to a first side and a second side, wherein a number of light emitting elements per unit area in the emission area of the third-type pixel is different from the number of light emitting elements per unit area in the emission area of the second-type pixel.

4. A display device comprising:

a display area in which a plurality of pixels comprising a plurality of subpixels are arranged, the plurality of subpixels each including an emission area;

a non-display area which surrounds the display area;

a plurality of electrodes, each of which includes at least a part extending in a direction in the display area and is spaced apart from each other in each of the plurality of subpixels;

a plurality of light emitting elements which are disposed on the plurality of electrodes in the emission area; and a plurality of contact electrodes, each contacting the plurality of light emitting elements and one of the plurality of electrodes, wherein the plurality of pixels comprise:

a first-type pixel which is disposed in the display area; and a second-type pixel which is disposed in an outermost part of the display area, and a number of light emitting elements per unit area in the emission area of the first-type pixel is different from a number of light emitting elements per unit area in the emission area of the second-type pixel, an area of the emission area of each of the plurality of subpixels of the second-type pixel is equal to an area of the emission area of each of the plurality of subpixels of the first-type pixel, and a number of light emitting elements in the emission area of the second-type pixel is smaller than a number of light emitting elements in the emission area of the first-type pixel.

5. The display device of claim 4, wherein
the plurality of pixels comprises a fourth-type pixel which is disposed inside and adjacent to the second-type pixel in the display area, and
a number of light emitting elements per unit area in the emission area of the fourth-type pixel is different from the number of light emitting elements per unit area in the emission area of the first-type pixel and the number of light emitting elements per unit area in the emission area of the second-type pixel.

6. The display device of claim 1, wherein
an area of the emission area of each of the plurality of subpixels of the second-type pixel is equal to each other, and
an area of the emission area of each of the plurality of subpixels of the second-type pixel is different from an area of the emission area of each of the plurality of subpixels of the first-type pixel.

7. The display device of claim 6, wherein
the area of the emission area of each of the plurality of subpixels of the second-type pixel is smaller than the area of the emission area of each of the plurality of subpixels of the first-type pixel, and
a number of light emitting elements in the emission area of each of the plurality of subpixels of the second-type pixel is equal to a number of light emitting elements in the emission area of each of the plurality of subpixels of the first-type pixel.

8. The display device of claim 7, wherein
the area of the emission area of each of the plurality of subpixels of the second-type pixel is smaller than the area of the emission area of each of the plurality of subpixels of the first-type pixel, and
a number of light emitting elements in the emission area of each of the plurality of subpixels of the second-type pixels is small than a number of light emitting elements in the emission area of each of the plurality of subpixels of the first-type pixel.

9. The display device of claim 6, wherein
the area of the emission area of each of the plurality of subpixels of the second-type pixel is larger than an area of the emission area of each of the plurality of subpixels of the first-type pixel, and
a number of light emitting elements in the emission area of each of the plurality of subpixels of the second-type pixel is smaller than a number of light emitting elements in the emission area of each of the plurality of subpixels of the first-type pixel.

10. The display device of claim 1, wherein
an area of the emission area of each of the plurality of subpixels of the first-type pixel is equal to each other,
a number of light emitting elements in the emission area of each of the plurality of subpixels of the first-type pixel is equal to each other,
an area of the emission area of each of the plurality of subpixels of the second-type pixel is different from each other, and
an area of the emission area of at least one of the plurality of subpixels of the second-type pixel is different from an area of the emission area of each of the plurality of subpixels of the first-type pixel.

11. The display device of claim 10, wherein a number of light emitting elements in the emission area of each of the plurality of subpixels of the second-type pixel is equal to a number of light emitting elements in the emission area of each of the plurality of subpixels of the first-type pixel.

12. The display device of claim 10, wherein a number of light emitting elements in the emission area of each of the plurality of subpixels of the second-type pixel is different from a number of light emitting elements in the emission area of each of the plurality of subpixels of the first-type pixel.

13. The display device of claim 10, wherein a number of light emitting elements in the emission area of each of the plurality of subpixels of the second-type pixel is different from each other.

14. The display device of claim 10, wherein
each of the plurality of electrodes disposed in each of the plurality of subpixels of the second-type pixel comprises an electrode bent part curved in another direction perpendicular to the direction, and
the plurality of subpixels of the second-type pixel are arranged in a diagonal direction between the direction and the another direction.

15. The display device of claim 14, wherein
each of the plurality of electrodes disposed in each of the plurality of subpixels of the second-type pixel comprises an electrode extending part connected to the electrode bent part and extending in the another direction, and
the plurality of subpixels of the second-type pixel are arranged in the another direction perpendicular to the direction.

16. A display device comprising:
a first side which extends in a first direction;
a second side which extends in a second direction different from the first direction; and
a corner, wherein
the first side and the second side meet at the corner,
an outer side of the corner is curved,
the display device further comprises:
a plurality of pixels comprising a plurality of electrodes extending in a direction;
a plurality of light emitting elements, each of the plurality of light emitting elements comprising ends disposed on the plurality of electrodes; and
a plurality of contact electrodes each contacting the plurality of light emitting elements and one of the plurality of electrodes,
each pixel of the plurality of pixels includes multiple light emitting elements of the plurality of light emitting elements, and
the plurality of pixels comprise:
a plurality of first-type pixels;
a plurality of second-type pixels which are disposed in an outermost part to surround the plurality of first-type pixels and are disposed in the corner; and
a plurality of third-type pixels which are disposed to correspond to the first side and the second side, and
a number of light emitting elements per unit area of an emission area, corresponding to a first opening in a bank, of the plurality of second-type pixels are different from a number of light emitting elements per unit area of an emission area, corresponding to a second opening in the bank, of the plurality of first-type pixels.

17. The display device of claim 16, wherein a number of light emitting elements of each of the plurality of second-type pixels is different from a number of light emitting elements of each of the plurality of first-type pixels.

18. The display device of claim 16, wherein an area of the emission area of each of the plurality of second-type pixels is different from an area of the emission area of each of the plurality of first-type pixels.

19. The display device of claim 16, wherein a number of light emitting elements per unit area in an emission area of the plurality of third-type pixels is different from a number of light emitting elements per unit area in the emission area of the plurality of second-type pixels.

20. The display device of claim 16, further comprising a plurality of fourth-type pixels which are disposed between the plurality of first-type pixels and the plurality of second-type pixels, wherein a number of light emitting elements per unit area in an emission area of each of the plurality of fourth-type pixels is different from a number of light emitting elements per unit area in the emission area of each of the plurality of first-type pixels and a number of light emitting elements per unit area in the emission area of each of the plurality of second-type pixels.

* * * * *